(12) United States Patent
Kim et al.

(10) Patent No.: US 12,131,789 B2
(45) Date of Patent: Oct. 29, 2024

(54) NONVOLATILE MEMORY DEVICE AND METHOD OF OPERATING THE SAME

(71) Applicant: Samsung Electronics Co., Ltd., Suwon-si (KR)

(72) Inventors: Junho Kim, Seongnam-si (KR); Jinyoung Kim, Daejeon (KR); Sehwan Park, Yongin-si (KR); Seoyoung Lee, Seoul (KR); Jisang Lee, Iksan-si (KR); Joonsuc Jang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 215 days.

(21) Appl. No.: 17/847,545

(22) Filed: Jun. 23, 2022

(65) Prior Publication Data
US 2023/0154552 A1 May 18, 2023

(30) Foreign Application Priority Data

Nov. 15, 2021 (KR) .................. 10-2021-0156352

(51) Int. Cl.
| | | |
|---|---|---|
| *G11C 16/34* | (2006.01) | |
| *G11C 16/08* | (2006.01) | |
| *G11C 16/10* | (2006.01) | |
| *G11C 16/26* | (2006.01) | |

(52) U.S. Cl.
CPC .......... *G11C 16/3459* (2013.01); *G11C 16/08* (2013.01); *G11C 16/102* (2013.01); *G11C 16/26* (2013.01); *G11C 16/3404* (2013.01)

(58) Field of Classification Search
CPC .................................. G11C 16/0483
See application file for complete search history.

(56) References Cited

U.S. PATENT DOCUMENTS

| | | | |
|---|---|---|---|
| 9,336,891 | B2 | 5/2016 | Yuan et al. |
| 9,472,298 | B1 | 10/2016 | Louie et al. |
| 9,824,778 | B2 | 11/2017 | Lee |
| 10,163,518 | B2 | 12/2018 | Yoon et al. |
| 10,665,312 | B2 | 5/2020 | Bang et al. |
| 10,734,082 | B2 | 8/2020 | Lee et al. |

(Continued)

FOREIGN PATENT DOCUMENTS

| | | |
|---|---|---|
| KR | 20180083689 A | 7/2018 |
| KR | 20190102599 A | 9/2019 |
| KR | 20190108347 A | 9/2019 |

*Primary Examiner* — Uyen Smet
(74) *Attorney, Agent, or Firm* — Muir Patent Law, PLLC

(57) ABSTRACT

Aggressor memory cells connected to one or more aggressor wordlines are grouped into aggressor cell groups by performing a read operation with respect to the aggressor wordlines based on one or more grouping read voltages, where the aggressor wordlines are adjacent to a selected wordline corresponding to a read address among wordlines of a memory block. Selected memory cells connected to the selected wordline are grouped into a selected cell groups respectively corresponding to the aggressor cell groups. Group read conditions respectively corresponding to the selected cell groups are determined and group read operations are performed with respect to the plurality of selected cell groups based on the group read conditions. The read errors are reduced by grouping the selected memory cells into the selected cell groups according to the change of operation environments.

18 Claims, 38 Drawing Sheets

(56) References Cited

U.S. PATENT DOCUMENTS

| | | |
|---|---|---|
| 10,910,080 B2 | 2/2021 | Bang et al. |
| 2012/0230104 A1* | 9/2012 | Kim .................. G11C 16/0483 |
| | | 365/185.18 |
| 2015/0138862 A1* | 5/2015 | Park .................. G11C 16/0483 |
| | | 365/51 |
| 2016/0225461 A1* | 8/2016 | Tuers .................... G11C 16/26 |
| 2018/0090216 A1* | 3/2018 | Hahn .................. G11C 11/5671 |
| 2018/0374541 A1* | 12/2018 | Jung .................. G11C 16/0483 |
| 2019/0287629 A1* | 9/2019 | Bang .................. G06F 11/1068 |
| 2021/0110874 A1* | 4/2021 | Shirakawa .......... G11C 11/5642 |

* cited by examiner

FIG. 23

T2B PROGRAM

CS1 ⟶ WLn(=WLs) ─────────
       WLn-1(=WLa) ─────────

CS2 ⟶ WLn+1(=WLas) ─────────
       WLn(=WLs) ─────────
       WLn-1(=WLam) ─────────

CS3 ⟶ WLn(=WLs) ─────────
       WLn-1(=WLam) ─────────
       WLn-2(=WLas) ─────────

FIG. 24

B2T PROGRAM

CS4 ⟶ WLn+1(=WLa) ─────────
       WLn(=WLs) ─────────

CS5 ⟶ WLn+1(=WLam) ─────────
       WLn(=WLs) ─────────
       WLn-1(=WLas) ─────────

CS6 ⟶ WLn+2(=WLas) ─────────
       WLn+1(=WLam) ─────────
       WLn(=WLs) ─────────

FIG. 31B
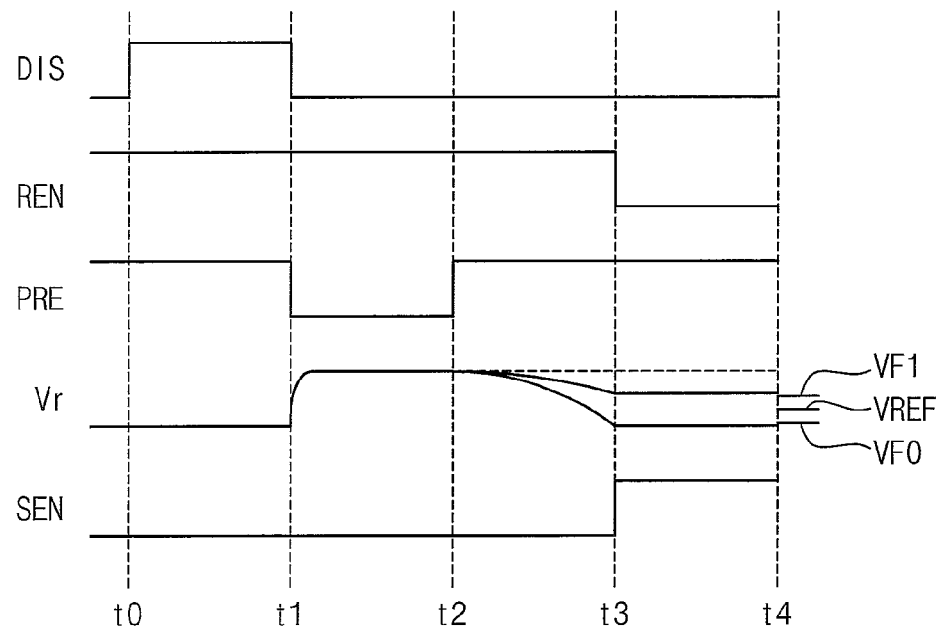
FIG. 32
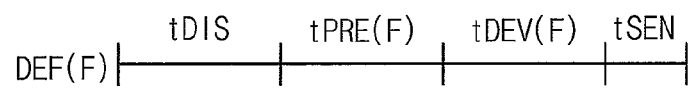

NONVOLATILE MEMORY DEVICE AND METHOD OF OPERATING THE SAME

CROSS-REFERENCE TO RELATED APPLICATION

This U.S. non-provisional application claims priority under 35 USC § 119 to Korean Patent Application No. 10-2021-0156352, filed on Nov. 15, 2021, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a nonvolatile memory device and a method of operating a nonvolatile memory device.

2. Discussion of the Related Art

A flash memory device, a resistive memory device, etc., can store data in accordance with a plurality of threshold voltage distributions or a plurality of resistance distributions, where each respective distribution is assigned to a corresponding logic state for stored data. The data stored by a memory cell may be read by determining whether the memory cell is turned ON/OFF when a predetermined read voltage is applied. During (and/or following) the programming of a memory cell, its intended distribution may be undesirably distorted due to a number of events or conditions including (e.g.,) charge leakage, program disturbances, read disturbances, word and/or bitline coupling, temperature change, voltage change, degeneration of the memory cell, etc. For example, the intended distribution may be shifted and/or broadened to cause a read fail such that incorrect data (i.e., data different from the stored data) are read out.

SUMMARY

Some example embodiments may provide a nonvolatile memory device and a method of operating a nonvolatile memory device capable of reducing read errors.

According to example embodiments, in a method of operating a nonvolatile memory device, aggressor memory cells connected to one or more aggressor wordlines are grouped into a plurality of aggressor cell groups by performing a read operation with respect to the aggressor wordlines based on one or more grouping read voltages, where the aggressor wordlines are adjacent to a selected wordline corresponding to a read address among a plurality of wordlines of a memory block. Selected memory cells connected to the selected wordline are grouped into a plurality of selected cell groups respectively corresponding to the plurality of aggressor cell groups. A plurality of group read conditions respectively corresponding to the plurality of selected cell groups are determined and a plurality of group read operations are performed with respect to the plurality of selected cell groups based on the plurality of group read conditions.

According to example embodiments, a nonvolatile memory device includes a memory cell array and a control circuit. A memory block of the memory cell array includes a plurality cell strings disposed between a plurality of bitlines and a source line, each cell string includes a plurality of memory cells stacked in a vertical direction, and a plurality of wordlines are stacked in the vertical direction. The control circuit is configured to group aggressor memory cells connected to one or more aggressor wordlines into a plurality of aggressor cell groups by performing a read operation with respect to the aggressor wordlines based on one or more grouping read voltages, the aggressor wordlines being adjacent to a selected wordline corresponding to a read address among the plurality of wordlines of a memory block, group selected memory cells connected to the selected wordline into a plurality of selected cell groups respectively corresponding to the plurality of aggressor cell groups, determine a plurality of group read conditions respectively corresponding to the plurality of selected cell groups and perform a plurality of group read operations with respect to the plurality of selected cell groups based on the plurality of group read conditions.

According to example embodiments, a nonvolatile memory device includes, a plurality of first metal pads disposed in a cell region, a plurality of second metal pads disposed in a peripheral region disposed under the cell region, wherein the peripheral region is vertically connected to the cell region by the plurality of first metal pads and the plurality of second metal pads, a memory cell array disposed in the cell region, the memory cell array including a memory block having a plurality cell strings coupled between a plurality of bitlines and a source line, each cell string includes a plurality of memory cells stacked in a vertical direction, and a plurality of wordlines stacked in the vertical direction, and a control circuit disposed in the peripheral region and configured to group aggressor memory cells connected to one or more aggressor wordlines into a plurality of aggressor cell groups by performing a read operation with respect to the aggressor wordlines based on one or more grouping read voltages, the aggressor wordlines being adjacent to a selected wordline corresponding to a read address among the plurality of wordlines of a memory block, group selected memory cells connected to the selected wordline into a plurality of selected cell groups respectively corresponding to the plurality of aggressor cell groups, determine a plurality of group read conditions respectively corresponding to the plurality of selected cell groups and perform a plurality of group read operations with respect to the plurality of selected cell groups based on the plurality of group read conditions.

The nonvolatile memory device and the method of operating the nonvolatile memory device according to example embodiments may reduce read errors and enhance reliability and performance of the nonvolatile memory device by grouping the selected memory cells into the plurality of selected cell groups according to the change of operation environments and adaptively determining the plurality of group read conditions respectively corresponding to the plurality of selected cell groups.

BRIEF DESCRIPTION OF THE DRAWINGS

Example embodiments of the present disclosure will be more clearly understood from the following detailed description taken in conjunction with the accompanying drawings.

FIGS. 23 and 24 are diagrams illustrating example embodiments of aggressor wordlines according to the programming operations of FIGS. 21 and 22.

FIGS. 31A, 31B and 32 are diagrams illustrating an example embodiment of determining group read conditions in a method of operating a nonvolatile memory device according to example embodiments.

DETAILED DESCRIPTION OF THE EMBODIMENTS

Figure 1:
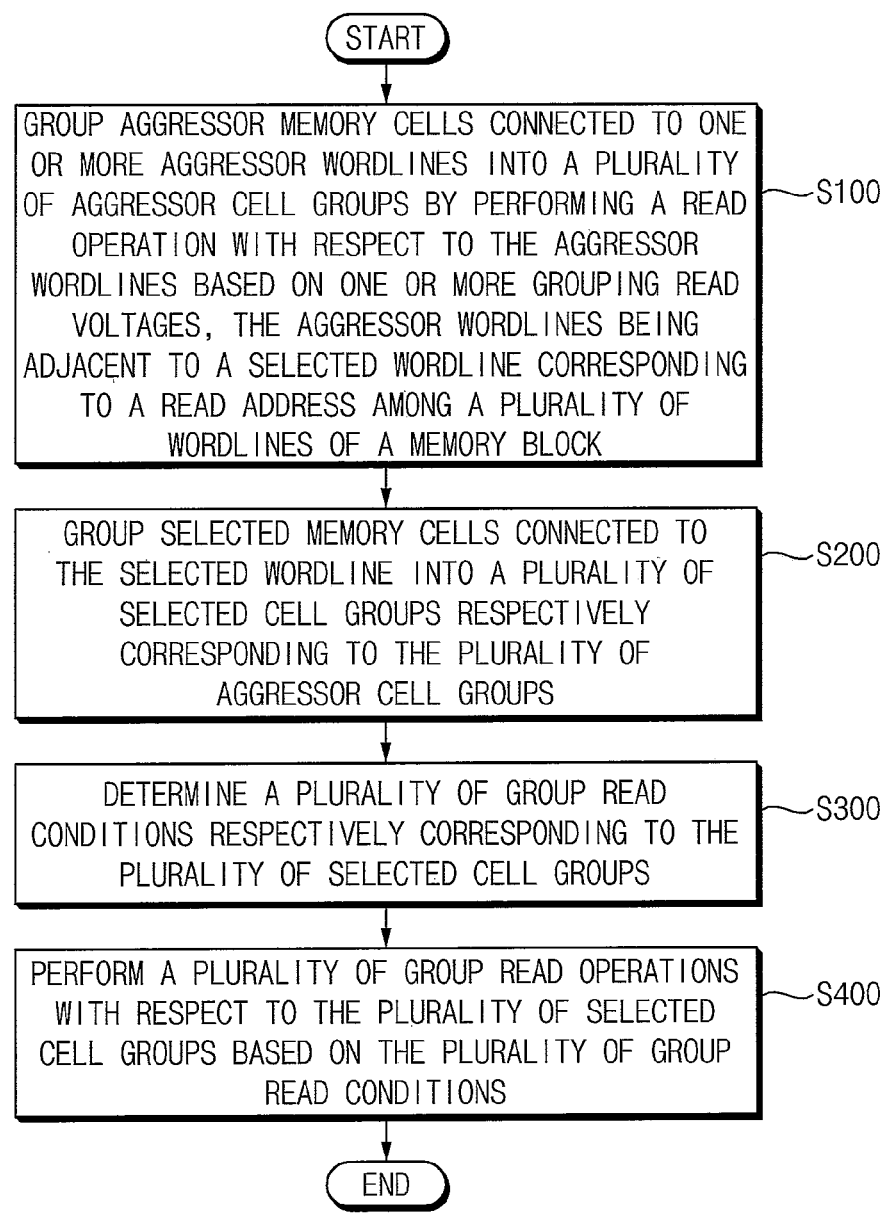
FIG. 1 is a flowchart illustrating a method of operating a nonvolatile memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flowchart illustrating a method of operating a nonvolatile memory device according to example embodiments.

Referring to FIG. 1, aggressor memory cells connected to one or more aggressor wordlines may be grouped into a plurality of aggressor cell groups by performing a read operation with respect to the aggressor wordlines based on one or more grouping read voltages, where the aggressor wordlines are adjacent to a selected wordline corresponding to a read address among a plurality of wordlines of a memory block (S100). Selected memory cells connected to the selected wordline may be grouped into a plurality of selected cell groups respectively corresponding to the plurality of aggressor cell groups (S200).

In some example embodiments, as will be described below with reference to FIGS. 8, 9, 10, 15, 16 and 17, the selected memory cells may be grouped into the plurality of selected cell groups based on the threshold voltages of the aggressor memory cells connected to one aggressor wordline. In some example embodiments, as will be described below with reference to FIGS. 19 and 20, the selected memory cells may be grouped into the plurality of selected cell groups based on the threshold voltages of the aggressor memory cells connected to two aggressor wordlines.

A plurality of group read conditions respectively corresponding to the plurality of selected cell groups may be determined (S300), and a plurality of group read operations may be performed with respect to the plurality of selected cell groups based on the plurality of group read conditions (S400).

In some example embodiments, as will be described below with reference to FIGS. 11, 12 and 18, the plurality of group read conditions may be a plurality of group read voltage sets respectively corresponding to the plurality of selected cell groups. In some example embodiments, as will be described below with reference to FIGS. 31A, 31B and 32, the plurality of group read conditions may be operational conditions such as a precharge time and a develop time.

As such, the nonvolatile memory device and the method of operating the nonvolatile memory device according to example embodiments may reduce read errors and enhance reliability and performance of the nonvolatile memory device by grouping the selected memory cells into a plurality of selected cell groups according to the change of operation environments and adaptively determining the plurality of group read conditions respectively corresponding to the plurality of selected cell groups.

Figure 2:
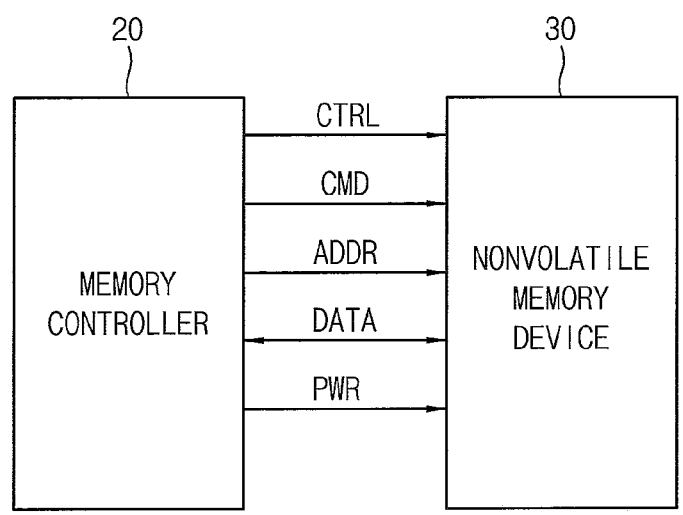
FIG. 2 is a block diagram illustrating a memory system according to example embodiments.

FIG. 2 is a block diagram illustrating a memory system according to example embodiments.

Referring to FIG. 2, a memory system 10 may include a memory controller 20 and at least one memory device 30. The memory device 30 may be a nonvolatile memory device as described herein. The memory system 10 may include data storage media based on a flash memory such as, for example, a memory card, a universal serial bus (USB) memory and a solid state drive (SSD).

The nonvolatile memory device 30 may perform a read operation, an erase operation, and a program operation or a write operation under control of the memory controller 20. The nonvolatile memory device 30 receives a command CMD such as a read command and a write command, an address ADDR such as a read address and a write address and data DATA through input/output lines from the memory controller 20 for performing such operations. In addition, the nonvolatile memory device 30 receives a control signal CTRL through a control line from the memory controller 20. In addition, the nonvolatile memory device 30 receives power PWR through a power line from the memory controller 20.

Figure 3:
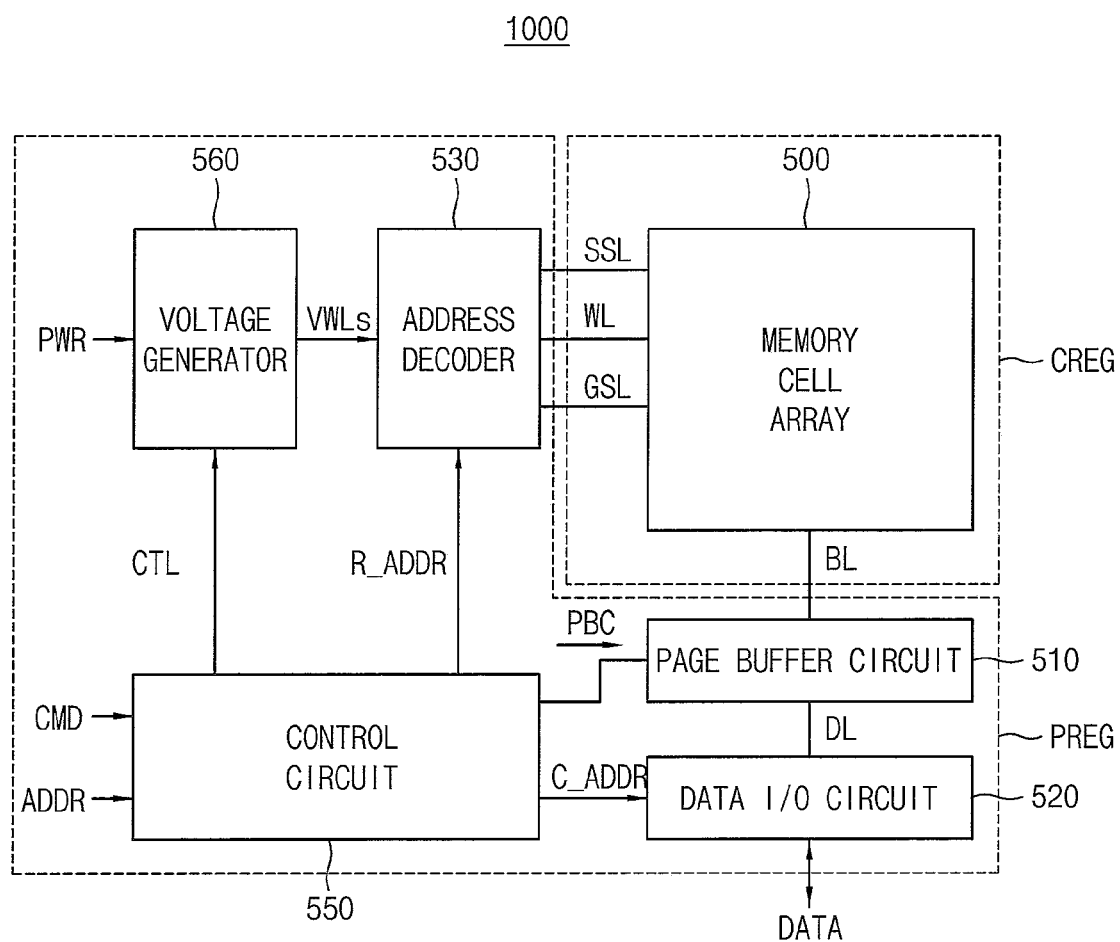
FIG. 3 is a block diagram illustrating a nonvolatile memory device according to example embodiments.

FIG. 3 is a block diagram illustrating a nonvolatile memory device according to example embodiments.

Referring to FIG. 3, a nonvolatile memory device 1000 may include a memory cell array 500, a page buffer circuit 510, a data input/output (I/O) circuit 520, an address decoder 530, a control circuit 550 and a voltage generator 560. The memory cell array 500 may be disposed in the cell region CREG in FIG. 40, and the page buffer circuit 510, the data I/O circuit 520, the address decoder 530, the control circuit 550 and the voltage generator 560 may be disposed in the peripheral region PREG in FIG. 40.

The memory cell array 500 may be coupled to the address decoder 530 through string selection lines SSL, wordlines WL, and ground selection lines GSL. In addition, the memory cell array 500 may be coupled to the page buffer circuit 510 through bitlines BL. The memory cell array 500 may include a memory cells coupled to the wordlines WL and the bitlines BL. In some example embodiments, the memory cell array 500 may be a three-dimensional memory cell array, which is formed on a substrate in a three-dimensional structure (for example, a vertical structure). In this case, the memory cell array 500 may include cell strings (e.g., NAND strings) that are vertically oriented such that at least one memory cell is overlapped vertically with another memory cell.

The control circuit 550 may receive a command (signal) CMD and an address (signal) ADDR from a memory controller. Accordingly, the control circuit 550 may control erase, program and read operations of the nonvolatile memory device 1000 in response to (or based on) at least one of the command signal CMD and the address signal ADDR. An erase operation may include performing a sequence of erase loops, and a program operation may include performing a sequence of program loops. Each program loop may include a program operation and a program verification operation. Each erase loop may include an erase operation and an erase verification operation. The read operation may include a normal read operation and data recover read operation.

For example, the control circuit 550 may generate the control signals CTL used to control the operation of the voltage generator 560, and may generate the page buffer control signal PBC for controlling the page buffer circuit 510 based on the command signal CMD, and generate the row address R_ADDR and the column address C_ADDR based on the address signal ADDR. The control circuit 550 may provide the row address R_ADDR to the address decoder 530 and provide the column address C_ADDR to the data I/O circuit 520.

The address decoder 530 may be coupled to the memory cell array 500 through the string selection lines SSL, the wordlines WL, and the ground selection lines GSL. During the program operation or the read operation, the address decoder 530 may determine or select one of the wordlines WL as a selected wordline and determine the remaining wordlines WL except for the selected wordline as unselected wordlines based on the row address R_ADDR.

During the program operation or the read operation, the address decoder 530 may determine one of the string selection lines SSL as a selected string selection line and determine rest of the string selection lines SSL except for the selected string selection line as unselected string selection lines based on the row address R_ADDR.

The voltage generator 560 may generate wordline voltages VWL, which are required for the operation of the memory cell array 500 of the nonvolatile memory device 1000, based on the control signals CTL. The voltage generator 560 may receive power PWR from the memory controller. The wordline voltages VWL may be applied to the wordlines WL through the address decoder 530.

For example, during the erase operation, the voltage generator 560 may apply an erase voltage to a well and/or a common source line of a memory block and apply an erase permission voltage (e.g., a ground voltage) to all or a portion of the wordlines of the memory block based on an erase address. During the erase verification operation, the voltage generator 560 may apply an erase verification voltage simultaneously to all of the wordlines of the memory block or sequentially (e.g., one by one) to the wordlines.

For example, during the program operation, the voltage generator 560 may apply a program voltage to the selected wordline and may apply a program pass voltage to the unselected wordlines. In addition, during the program verification operation, the voltage generator 560 may apply a program verification voltage to the first wordline and may apply a verification pass voltage to the unselected wordlines.

During the normal read operation, the voltage generator 560 may apply a read voltage to the selected wordline and may apply a read pass voltage to the unselected wordlines. During the data recover read operation, the voltage generator 560 may apply the read voltage to a wordline adjacent to the selected wordline and may apply a recover read voltage to the selected wordline.

The page buffer circuit 510 may be coupled to the memory cell array 500 through the bitlines BL. The page buffer circuit 510 may include multiple buffers. In some example embodiments, each buffer may be connected to a single bitline. In other example embodiments, each buffer may be connected to two or more bitlines. The page buffer circuit 510 may temporarily store data to be programmed in a selected page or data read out from the selected page of the memory cell array 500.

The data I/O circuit 520 may be coupled to the page buffer circuit 510 through data lines DL. During the program operation, the data I/O circuit 520 may receive program data DATA received from the memory controller and provide the program data DATA to the page buffer circuit 510 based on the column address C_ADDR received from the control circuit 550. During the read operation, the data I/O circuit 520 may provide read data DATA, having been read from the memory cell array 500 and stored in the page buffer circuit 510, to the memory controller based on the column address C_ADDR received from the control circuit 550.

In addition, the page buffer circuit 510 and the data I/O circuit 520 may read data from a first area of the memory cell array 500 and write the read data to a second area of the memory cell array 500 (e.g., without transmitting the data to a source external to the nonvolatile memory device 1000, such as to the memory controller). For example, the page buffer circuit 510 and the data I/O circuit 520 may perform a copy-back operation.

Figure 4:
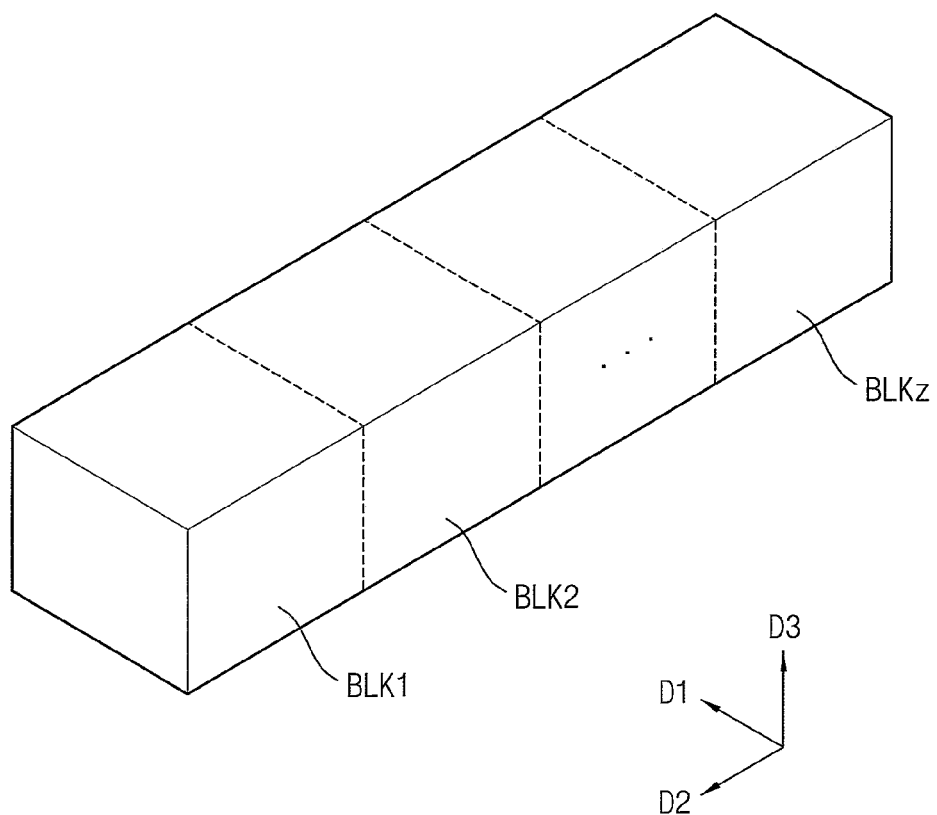
FIG. 4 is a block diagram illustrating a memory cell array included in the nonvolatile memory device of FIG. 3.
Figure 5:
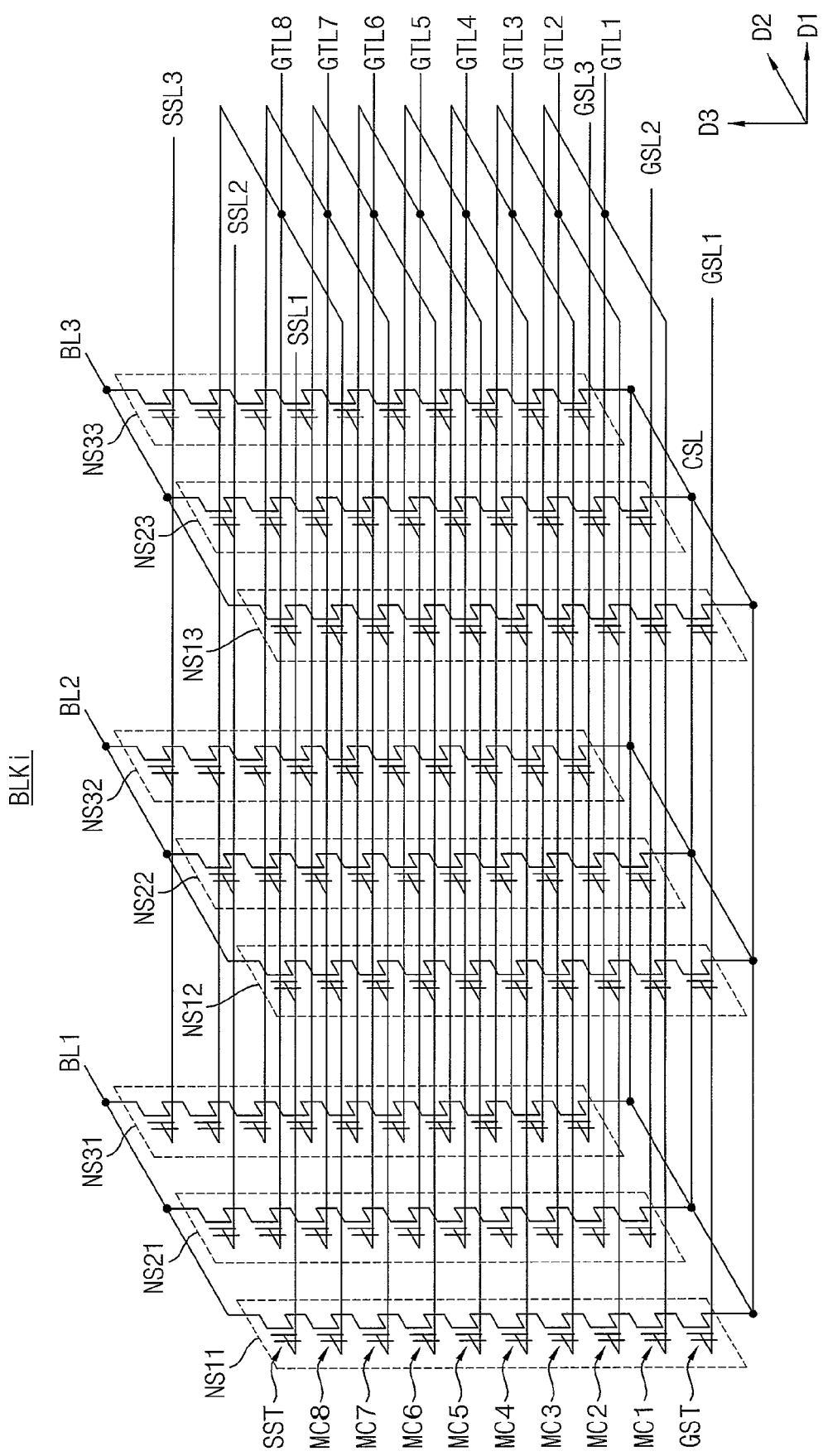
FIG. 5 is a circuit diagram illustrating an equivalent circuit of a memory block included in the memory cell array of FIG. 4.

FIG. 4 is a block diagram illustrating a memory cell array included in the nonvolatile memory device of FIG. 3, and FIG. 5 is a circuit diagram illustrating an equivalent circuit of a memory block included in the memory cell array of FIG. 4.

Referring to FIG. 4, the memory cell array 500 may include memory blocks BLK1 to BLKz. In some example embodiments, the memory blocks BLK1 to BLKz may be selected by the address decoder 430 in FIG. 3. For example, the address decoder 430 may select a particular memory block BLK among the memory blocks BLK1 to BLKz corresponding to a block address.

The memory block BLKi of FIG. 5 may be formed on a substrate in a three-dimensional structure (for example, a vertical structure). For example, NAND strings or cell strings included in the memory block BLKi may be disposed in the vertical direction D3 perpendicular to the upper surface of the substrate.

Referring to FIG. 5, the memory block BLKi may include cell strings or NAND strings NS11 to NS33 coupled between bitlines BL1, BL2 and BL3 and a common source line CSL. Each NAND string may include a plurality of memory cells stacked in the vertical direction D3, and the plurality of wordlines may be stacked in the vertical direction D3.

Each of the NAND strings NS11 to NS33 may include a string selection transistor SST, memory cells MC1 to MC8, and a ground selection transistor GST. In FIG. 5, each of the NAND strings NS11 to NS33 is illustrated to include eight memory cells MC1 to MC8. However, embodiments are not limited thereto. In some embodiments, each of the NAND strings NS11 to NS33 may include any number of memory cells.

Each string selection transistor SST may be connected to a corresponding string selection line (for example, one of SSL1 to SSL3). The memory cells MC1 to MC8 may be connected to corresponding gate lines GTL1 to GTL8, respectively. The gate lines GTL1 to GTL8 may be wordlines, and some of the gate lines GTL1 to GTL8 may be dummy wordlines. Each ground selection transistor GST may be connected to a corresponding ground selection line (for example, one of GSL1 to GSL3). Each string selection transistor SST may be connected to a corresponding bitline (e.g., one of BL1, BL2 and BL3), and each ground selection transistor GST may be connected to the common source line CSL.

The wordline (each of the gate lines GTL1 to GTL8) having the same height may be commonly connected, and the ground selection lines GSL1 to GSL3 and the string selection lines SSL1 to SSL3 may be separated. In FIG. 5, the memory block BLKi is illustrated to be coupled to eight gate lines GTL1 to GTL8 and three bitlines BL1 to BL3. However, example embodiments are not limited thereto. Each memory block in the memory cell array 500 may be coupled to any number of wordlines and any number of bitlines.

Figure 6:
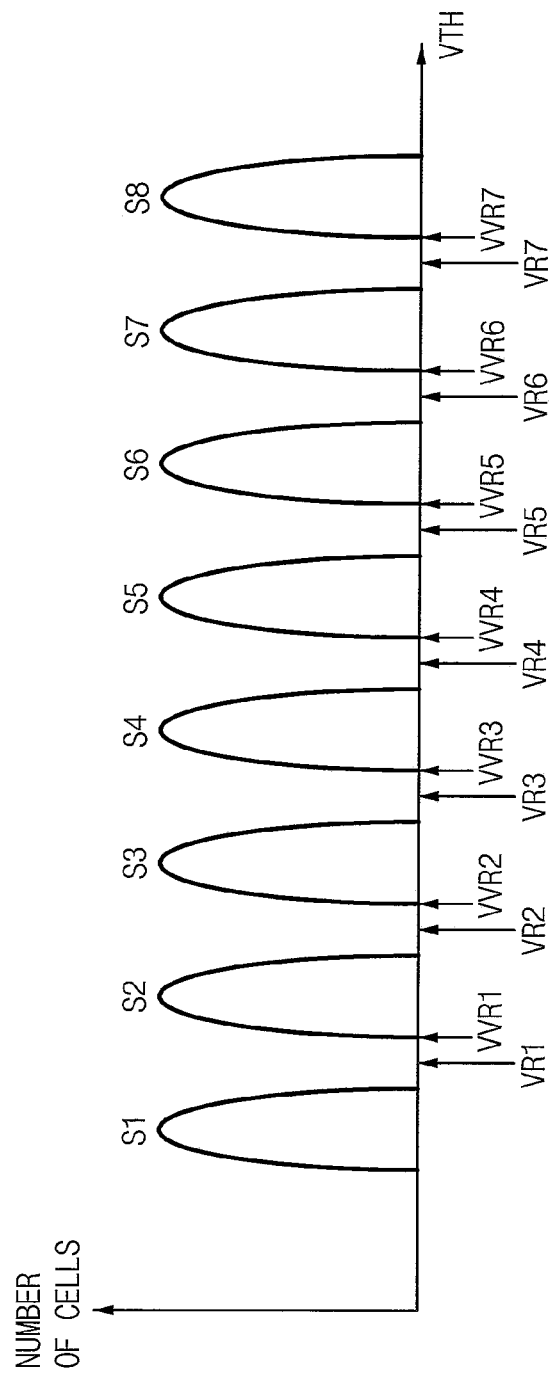
FIG. 6 is a diagram illustrating example states of multi-level cells included in a nonvolatile memory device according to example embodiments.

FIG. 6 is a diagram illustrating example states of multi-level cells included in a nonvolatile memory device according to example embodiments.

FIG. 6 illustrates first through eighth states S1~S8 of a triple level cell (TLC) memory where each memory cell of the TLC memory may store three data bits. In FIG. 6, the horizontal axis represents a threshold voltage VTH of memory cells and the vertical axis represents the number of the memory cells corresponding to the threshold voltage VTH. During the program operation, the program success of the first through eighth states S1~S8 may be distinguished by respectively applying first through seventh verification read voltage VVR1~VVR7 to the selected wordline. In addition, during the normal read operation, the first through eighth states S1~S8 may be distinguished by applying at least a portion of first through seventh normal read voltages VR1~VR7 to the selected wordline.

Figure 7:
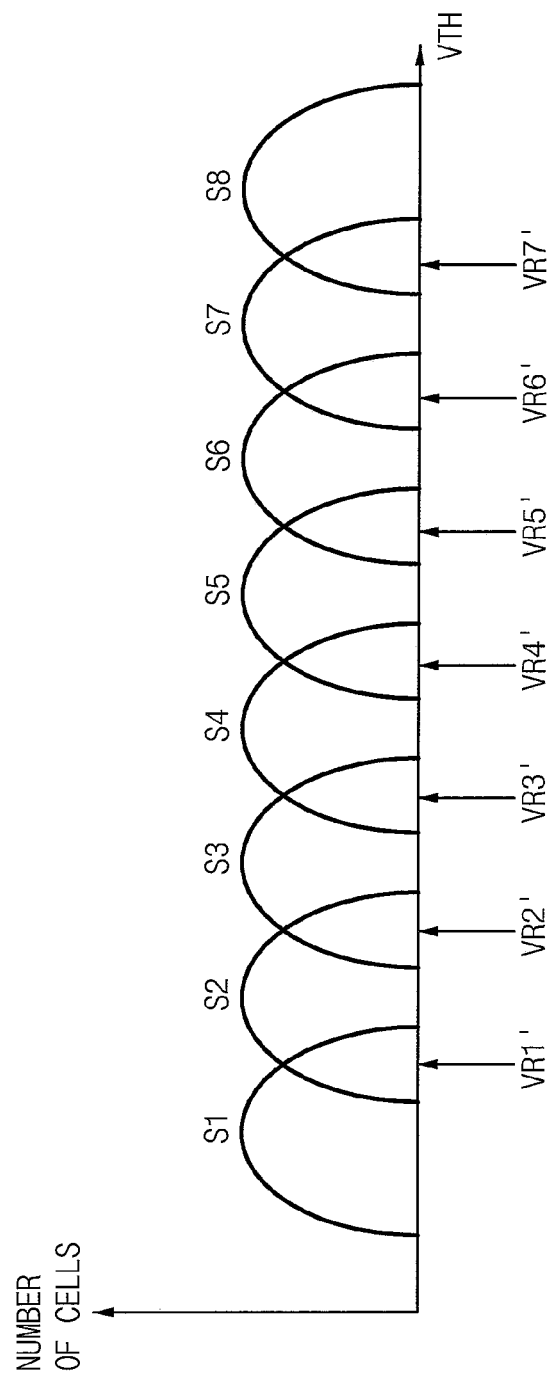
FIG. 7 is a diagram illustrating degenerated states from the states of FIG. 6.

FIG. 7 is a diagram illustrating degenerated states from the states of FIG. 6.

The threshold voltage distributions with respect to the states S1~S8 of FIG. 6 may be degenerated as illustrated in FIG. 7. During or after programming of memory cells, the intended distributions may be undesirably distorted due to a number of events or conditions including (e.g.,) charge leakage, program disturbances, read disturbances, wordline and/or bitline coupling, temperature change, voltage change, degeneration of the memory cells, etc. For example, the intended distributions may be shifted and/or broadened. According to the degeneration degree of the memory cells, the read operation based on the read voltages VR1~VR7 in FIG. 6 may cause a read fail that incorrect data (i.e., different from the stored data) are read out. When the read fail occurs, the nonvolatile memory device may perform a recovery read operation such that the optimal read voltages VR1'~VR7' as illustrated in FIG. 7 are searched to try another read operation based on the optimal read voltages VR1'~VR7'. However, if the degeneration degree is serious, it may be impossible to discern the states S1~S7 even by the optimal read voltages VR1'~VR7'.

According to example embodiments, the read error or read fail may be reduced by grouping the selected memory cells connected to the selected wordline according to the states of the aggressor memory cells adjacent to the selected memory cells.

Figure 8:
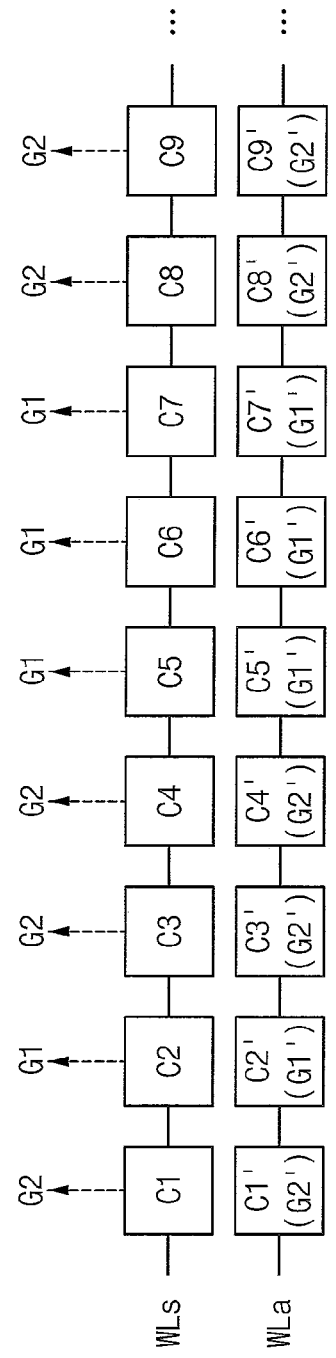
FIGS. 8, 9 and 10 are diagrams illustrating an example embodiment of grouping memory cells in a method of operating a nonvolatile memory device according to example embodiments.
Figure 9:
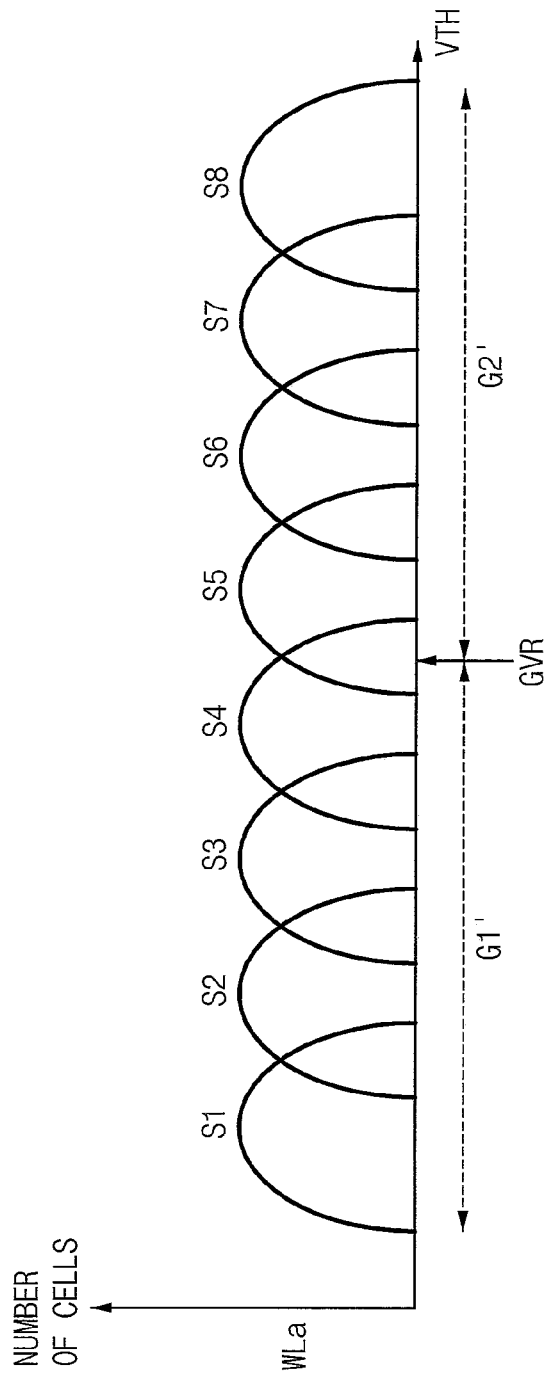
Figure 10:
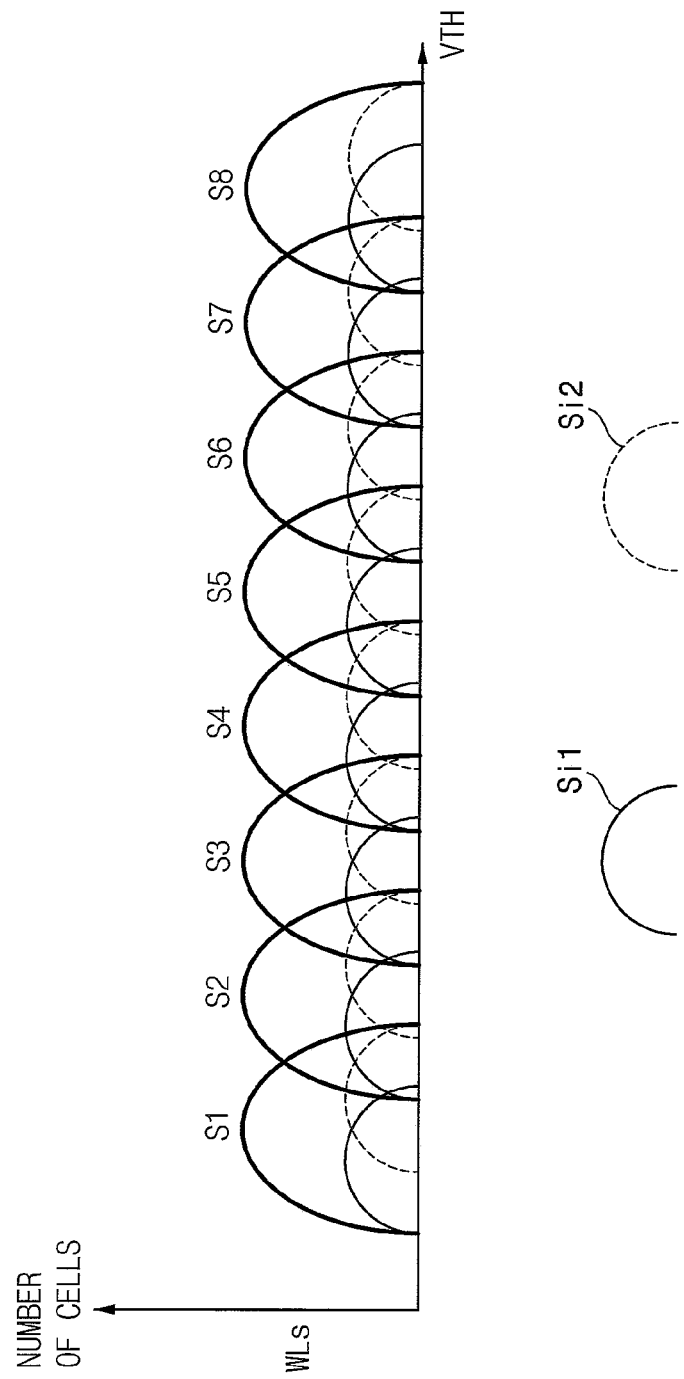

FIGS. 8, 9 and 10 are diagrams illustrating an example embodiment of grouping memory cells in a method of operating a nonvolatile memory device according to example embodiments.

FIG. 8 illustrates a selected wordline WLs and one aggressor wordline WLa adjacent to the selected wordline WLs. The selected wordline WLs may include a plurality of selected memory cells C1~C9 and the aggressor wordline WLa may include a plurality of aggressor memory cells C1'~C9' respectively adjacent to the selected memory cells C1~C9.

FIG. 9 illustrates an example embodiment in which the aggressor memory cells of the aggressor wordline WLa are grouped into two aggressor cell groups, for example, a first aggressor cell group G1' and a second aggressor cell group G2', based on one grouping read voltage GVR. The first aggressor cell group G1' may include the aggressor memory cells having the relatively low threshold voltages and the second aggressor cell group G2' may include the aggressor memory cells having the relatively high threshold voltages.

For example, as illustrated in FIG. 8, the aggressor memory cells C2', C5', C6' and C7' may be included in the first aggressor cell group G1' and the aggressor memory cells C1', C3', C4', C8' and C9' may be included in the second aggressor cell group G2'.

The selected memory cells C1~C9 of the selected wordline WLs may be grouped into the respective selected cell groups according to the respective aggressor cell groups of the aggressor memory cells adjacent to the selected memory cells. In the example of FIG. 8, the selected memory cells C2, C5, C6 and C7 corresponding to the aggressor memory cells C2', C5', C6' and C7' of the first aggressor cell group G1' may be included in a first selected cell group G1 and the selected memory cells C1, C3, C4, C8 and C9 corresponding to the aggressor memory cells C1', C3', C4', C8' and C9' of the second aggressor cell group G2' may be included in a second selected cell group G2.

FIG. 10 illustrates threshold voltage distributions according to grouping of the selected memory cells of the selected wordline WLs. Each state Si (i=1~8) may be divided into a first sub state Si1 corresponding to the first selected cell group G1 and a second sub state Si2 corresponding to the second selected cell group G2.

Figure 11:
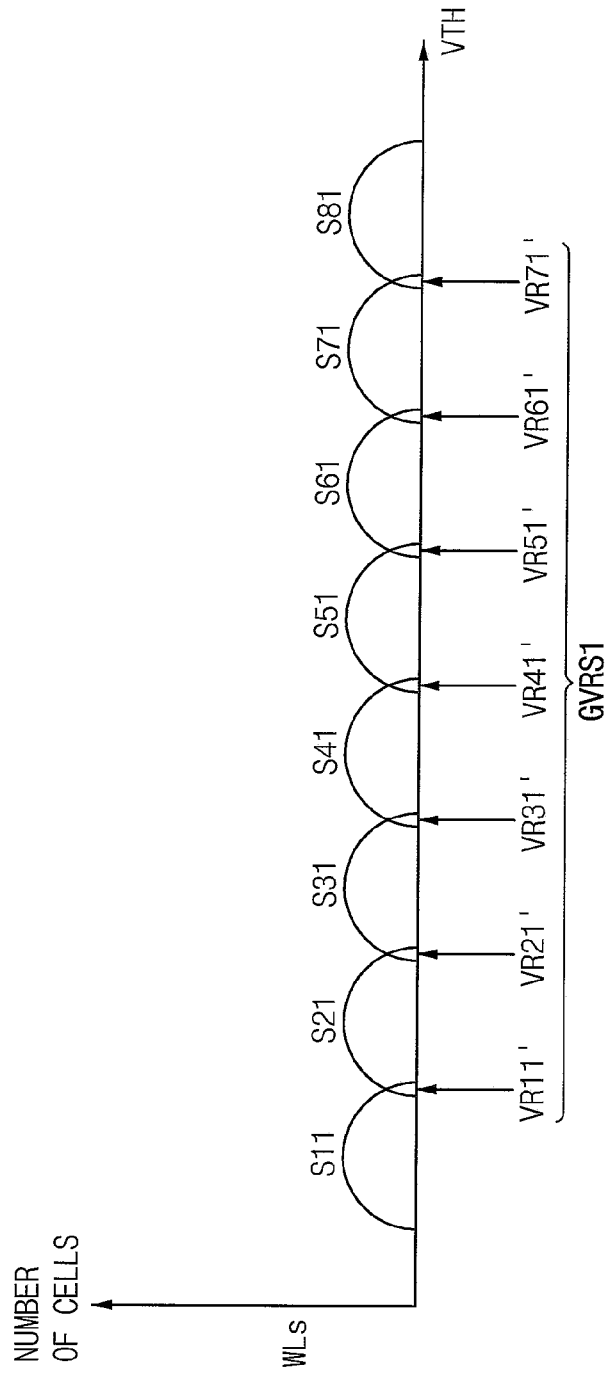
FIGS. 11 and 12 are diagrams illustrating an example embodiment of determining group read conditions according to grouping of FIGS. 8, 9 and 10.
Figure 12:
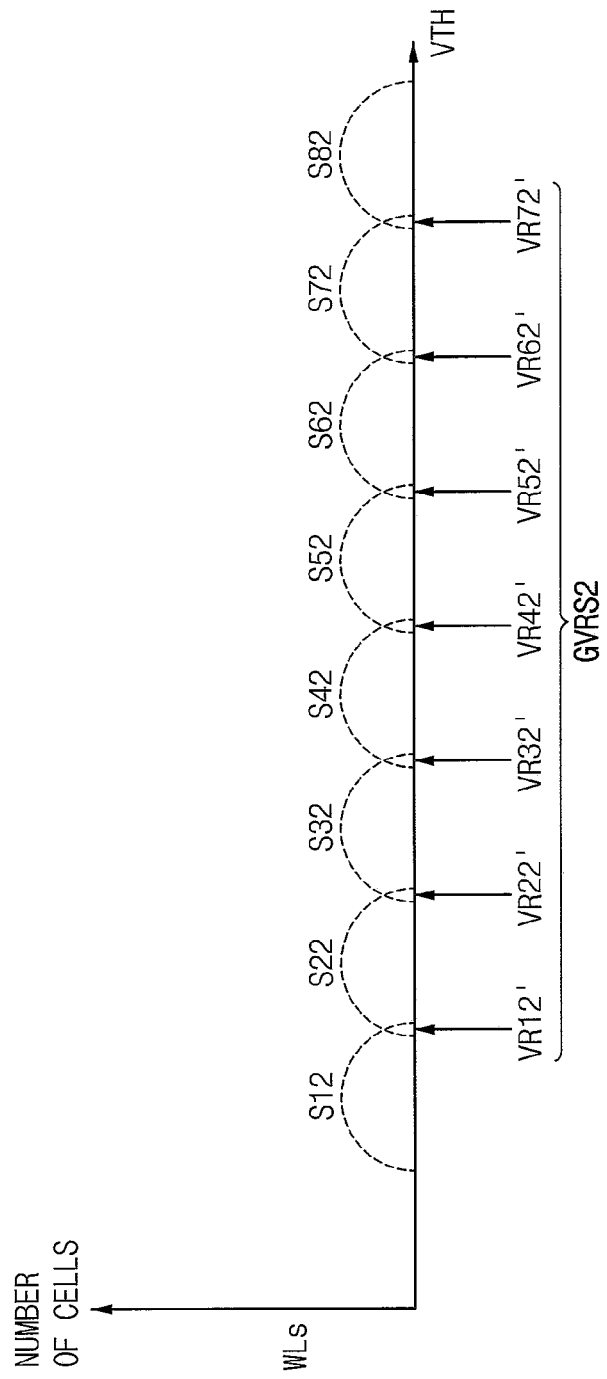

FIGS. 11 and 12 are diagrams illustrating an example embodiment of determining group read conditions according to the cell grouping of FIGS. 8, 9 and 10.

FIG. 11 illustrates threshold voltage distributions of the first sub states S11~S81 of the selected memory cells included in the first selected cell group G1. A first group read voltage set GVRS1 including optimal read voltages VR11'~VR71' corresponding to the first selected cell group G1 may be determined by performing a plurality of valley search operations. The valley search operation will be described below with reference to FIGS. 33 through 35.

FIG. 12 illustrates threshold voltage distributions of the second sub states S12~S82 of the selected memory cells included in the second selected cell group G2. A second group read voltage set GVRS2 including optimal read voltages VR12'~VR72' corresponding to the second selected cell group G2 may be determined by performing a plurality of valley search operations.

As such, the valley search operations may be performed with respect to each of the plurality of selected cell groups G1 and G2, and the plurality of group read voltage sets GVRS1 and GVRS2 respectively corresponding to the plurality of selected cell groups G1 and G2 may be determined based on the valley search operations.

Figure 13:
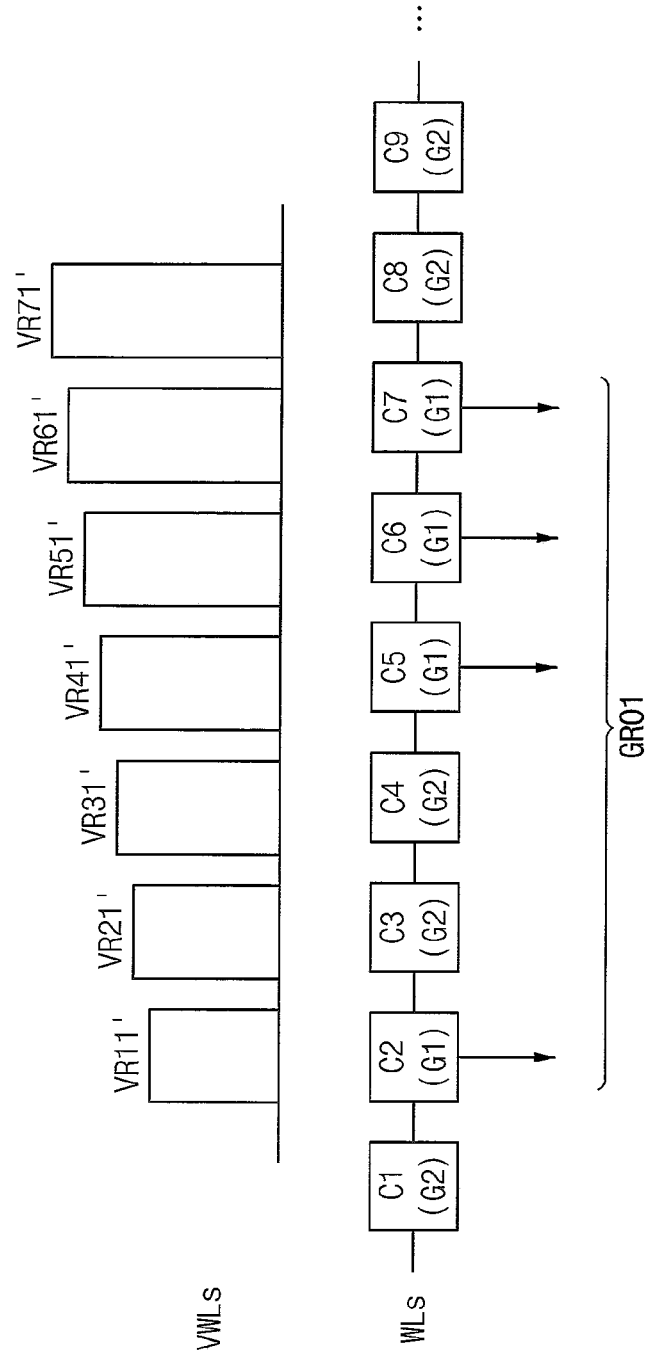
FIGS. 13 and 14 are diagrams an example embodiment of group read operations based on the group read conditions of FIGS. 11 and 12.
Figure 14:
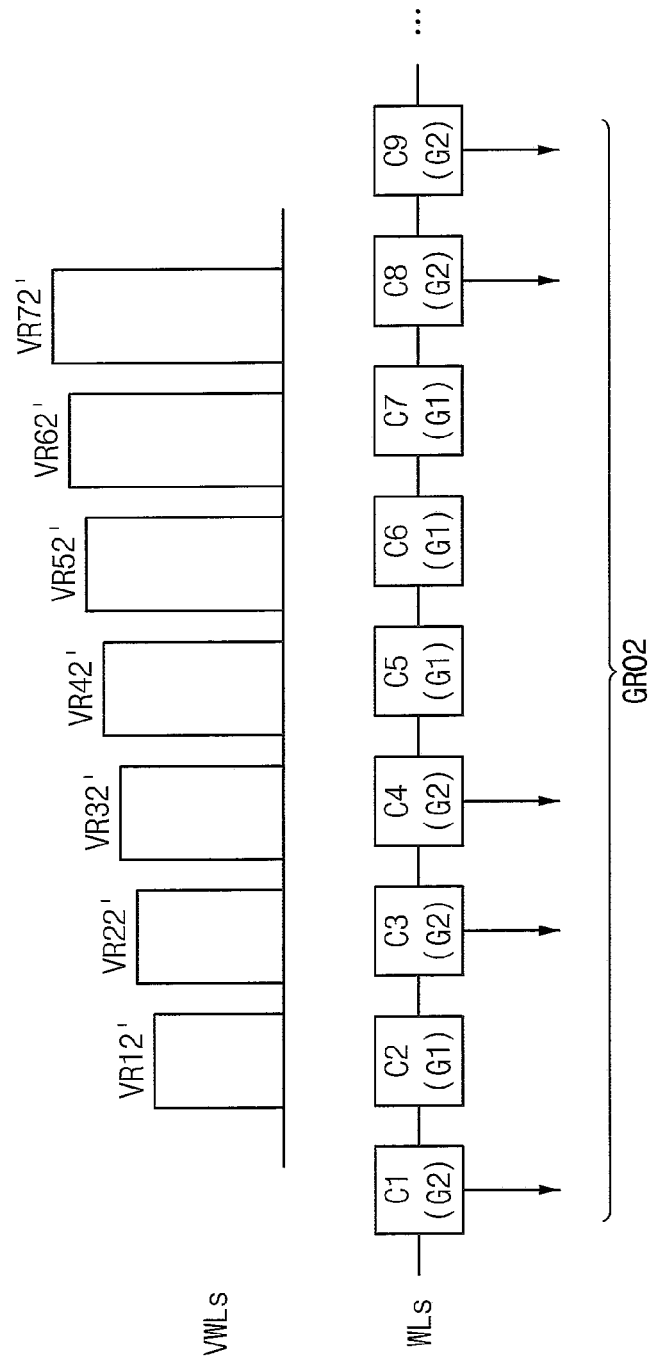

FIGS. 13 and 14 are diagrams of an example embodiment of group read operations based on the group read conditions of FIGS. 11 and 12.

Referring to FIG. 13, a first group read operation GRO1 may be performed to read output data of the selected memory cells C2, C5, C6 and C7 of the first selected cell group G1, by applying the selected wordline voltage VWLs corresponding to the first selected cell group G1 to the selected wordline WLs. In this case, data read from the selected memory cells C1, C3, C4, C8, C9 that are not included in the first selected cell group G1 may be neglected. The selected wordline voltage VWLs may have the voltage levels corresponding to the first group read voltage set GVRS1, that is, the optimal read voltages VR11'~VR71' corresponding to the first selected cell group G1. FIG. 13 illustrates the optimal read voltages VR11'~VR71' are sequentially distributed with respect to the selected wordline WLs from the lowest voltage VR11' to the highest voltage VR71', but example embodiments are not limited thereto. The order of applying the optimal read voltages VR11'~VR71' may be determined variously.

Referring to FIG. 14, a second group read operation GRO2 may be performed to read output data of the selected memory cells C1, C3, C4, C8 and C9 of the second selected cell group G2, by applying the selected wordline voltage VWLs corresponding to the second selected cell group G2 to the selected wordline WLs. In this case, data read from the selected memory cells C2, C5, C6 and C7 that are not included in the second selected cell group G2 may be neglected. The selected wordline voltage VWLs may have the voltage levels corresponding to the second group read voltage set GVRS2, that is, the optimal read voltages VR12'~VR72' corresponding to the second selected cell group G2.

As such, a plurality of group read operations GRO1 and GRO2 may be performed with respect to the plurality of selected cell groups G1 and G2 based on the plurality of group read conditions, for example, the plurality of group read voltage sets GRVS1 and GRVS2.

Figure 15:
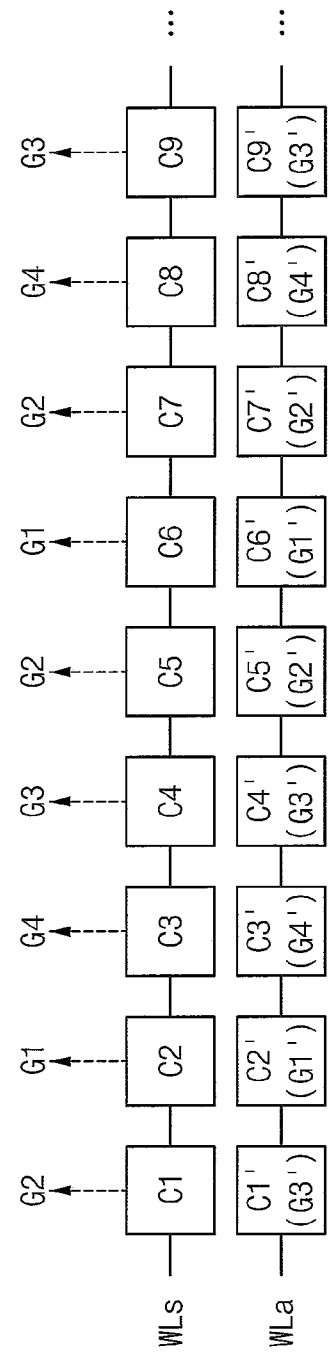
FIGS. 15, 16 and 17 are diagrams illustrating an example embodiment of grouping memory cells in a method of operating a nonvolatile memory device according to example embodiments.
Figure 16:
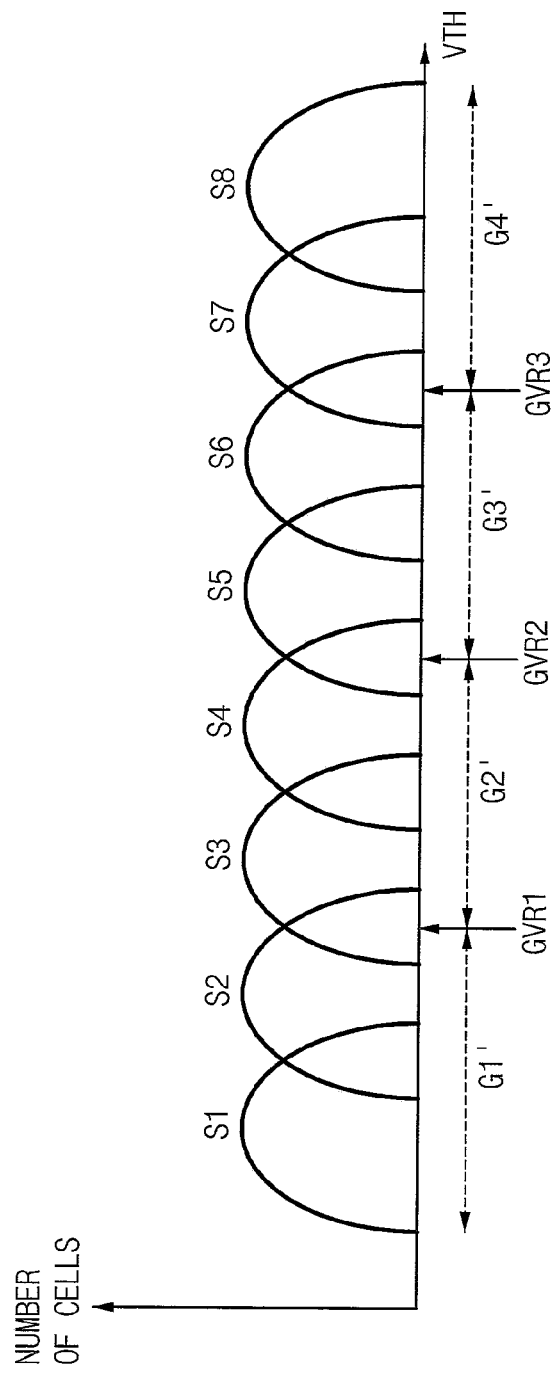
Figure 17:
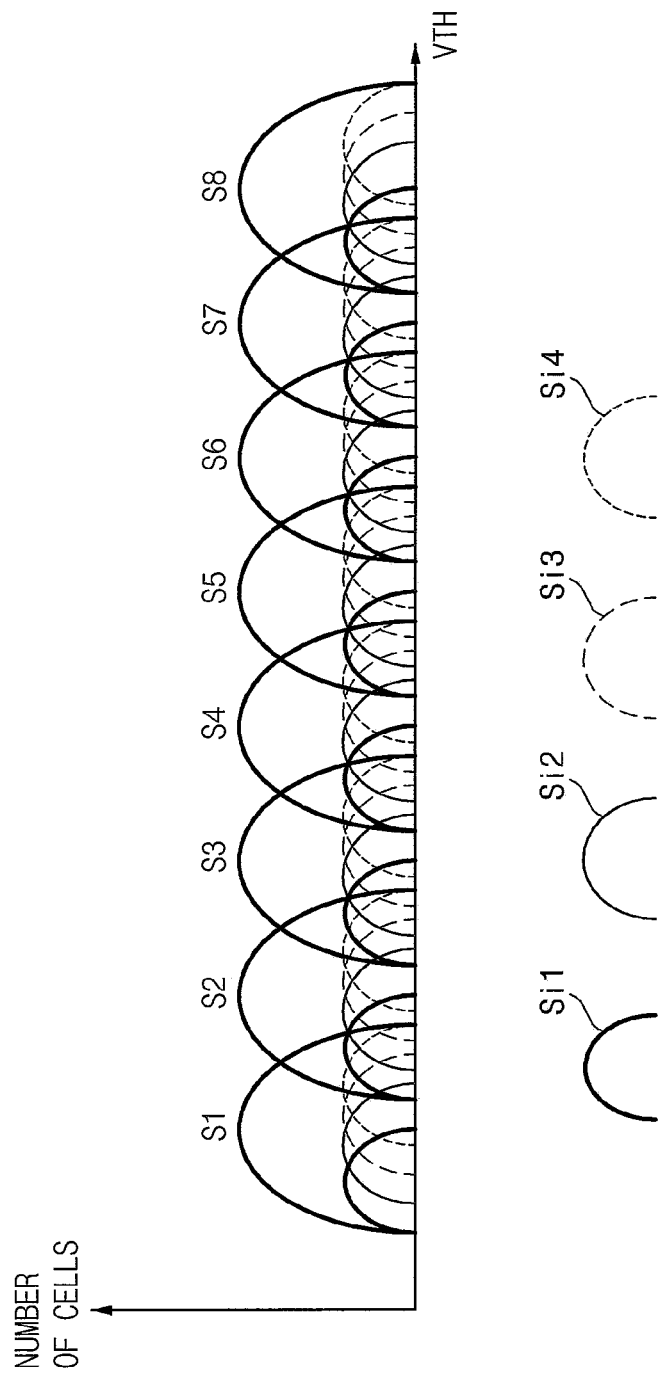

FIGS. 15, 16 and 17 are diagrams illustrating an example embodiment of grouping memory cells in a method of operating a nonvolatile memory device according to example embodiments.

FIG. 15 illustrates a selected wordline WLs and one aggressor wordline WLa adjacent to the selected wordline WLs. The selected wordline WLs may include a plurality of selected memory cells C1~C9 and the aggressor wordline WLa may include a plurality of aggressor memory cells C1'~C9' respectively adjacent to the selected memory cells C1~C9.

FIG. 16 illustrates an example embodiment in which the aggressor memory cells of the aggressor wordline are grouped into four aggressor cell groups, that is, a first aggressor cell group G1', a second aggressor cell group G2', a third aggressor cell group G3' and a fourth aggressor cell group G4', based on three group read voltages GVR1, GRV2 and GRV3. As such, the aggressor memory cells may be grouped into the first through fourth aggressor cell groups G1'~G4' having different threshold voltage ranges based on the first through third grouping read voltages GVR1~GVR3.

For example, as illustrated in FIG. 15, the aggressor memory cells C2' and C6' may be included in the first aggressor cell group G1', the aggressor memory cells C5' and C7' may be included in the second aggressor cell group G2', the aggressor memory cells C1', C4' and C9' may be included in the third aggressor cell group G3' and the aggressor memory cells C3' and C8' may be included in the fourth aggressor cell group G4'.

The selected memory cells C1~C9 of the selected wordline WLs may be grouped into the respective selected cell groups according to the respective aggressor cell groups of the aggressor memory cells adjacent to the selected memory cells. In the example of FIG. 15, the selected memory cells C2 and C6 corresponding to the aggressor memory cells C2' and C6' of the first aggressor cell group G1' may be included in a first selected cell group G1, the selected memory cells C5 and C7 corresponding to the aggressor memory cells C5' and C7' of the second aggressor cell group G2' may be included in a second selected cell group G2, the selected memory cells C1, C4 and C9 corresponding to the aggressor memory cells C1', C4' and C9' of the third aggressor cell group G3' may be included in a third selected cell group G3, and the selected memory cells C3 and C8 corresponding to the aggressor memory cells C3' and C8' of the fourth aggressor cell group G4' may be included in a fourth selected cell group G4.

FIG. 17 illustrates threshold voltage distributions according to grouping of the selected memory cells of the selected wordline WLs. Each state Si (i=1~8) may be divided into a first sub state Si1 corresponding to the first selected cell group G1, a second sub state Si2 corresponding to the second selected cell group G2, a third sub state Si3 corresponding to the third selected cell group G3, and a fourth sub state Si4 corresponding to the fourth selected cell group G4.

Figure 18:
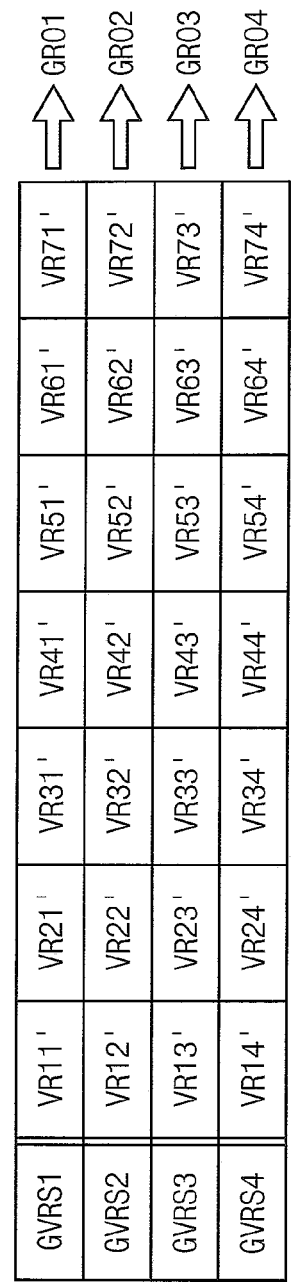
FIG. 18 is a diagram illustrating an example embodiment of group read conditions that are determined according to grouping of FIGS. 15, 16 and 17.

FIG. 18 is a diagram illustrating an example embodiment of group read conditions that are determined according to grouping of FIGS. 15, 16 and 17.

Referring to FIGS. 15 through 18, first through fourth group read voltage sets GVRS1~GVRS4 respectively corresponding to the first through fourth selected cell groups G1~G4 may be determined by performing a plurality of valley search operations. As described with reference to FIGS. 11 and 12, the first group read voltage set GVRS1 may include optimal read voltages VR11'~VR71' corresponding to the first selected cell group G1, the second group read voltage set GVRS2 may include optimal read voltages VR12'~VR72' corresponding to the second selected cell group G2, the third group read voltage set GVRS3 may include optimal read voltages VR13'~VR73' corresponding to the third selected cell group G3, and the fourth group read voltage set GVRS4 may include optimal read voltages VR14'~VR74' corresponding to the fourth selected cell group G4.

As such, the valley search operations may be performed with respect to each of the plurality of selected cell groups G1~G4, and the plurality of group read voltage sets GVRS1~GVRS4 respectively corresponding to the plurality of selected cell groups G1~G2 may be determined based on the valley search operations. A plurality of group read operations GRO1~GRO4 may be performed with respect to the plurality of selected cell groups G1~G4 based on the plurality of group read conditions, for example, the plurality of group read voltage sets GRVS1~GRVS4, as described with reference to FIGS. 13 and 14.

Figure 19:
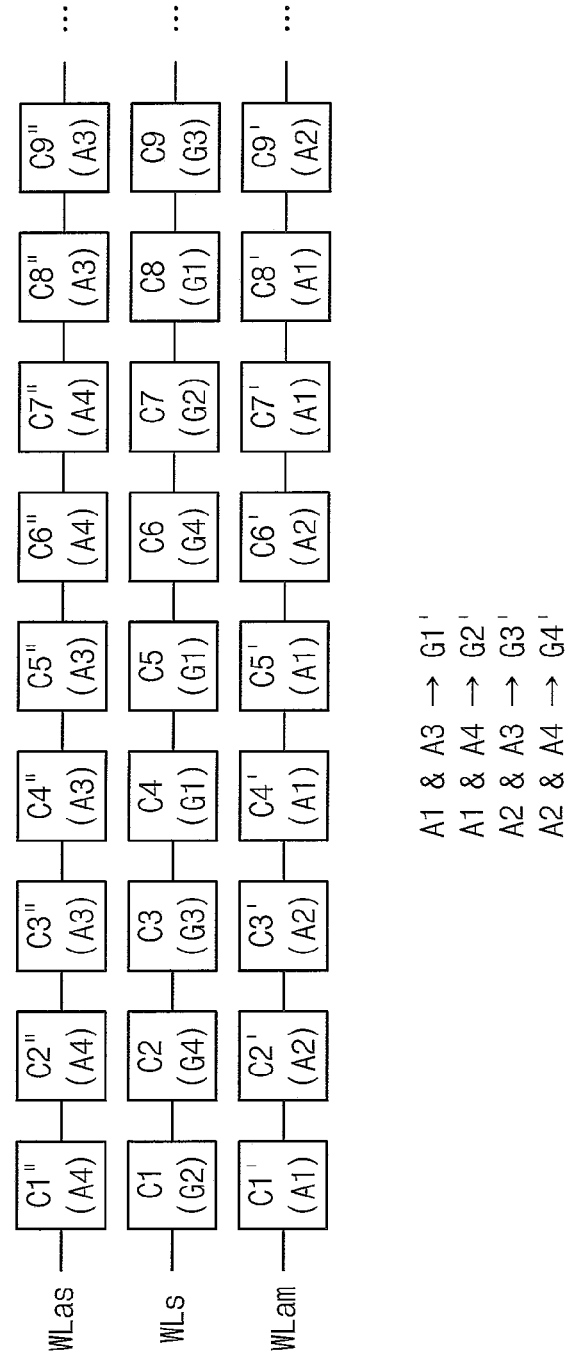
FIGS. 19 and 20 are diagrams illustrating an example embodiment of grouping memory cells in a method of operating a nonvolatile memory device according to example embodiments.
Figure 20:
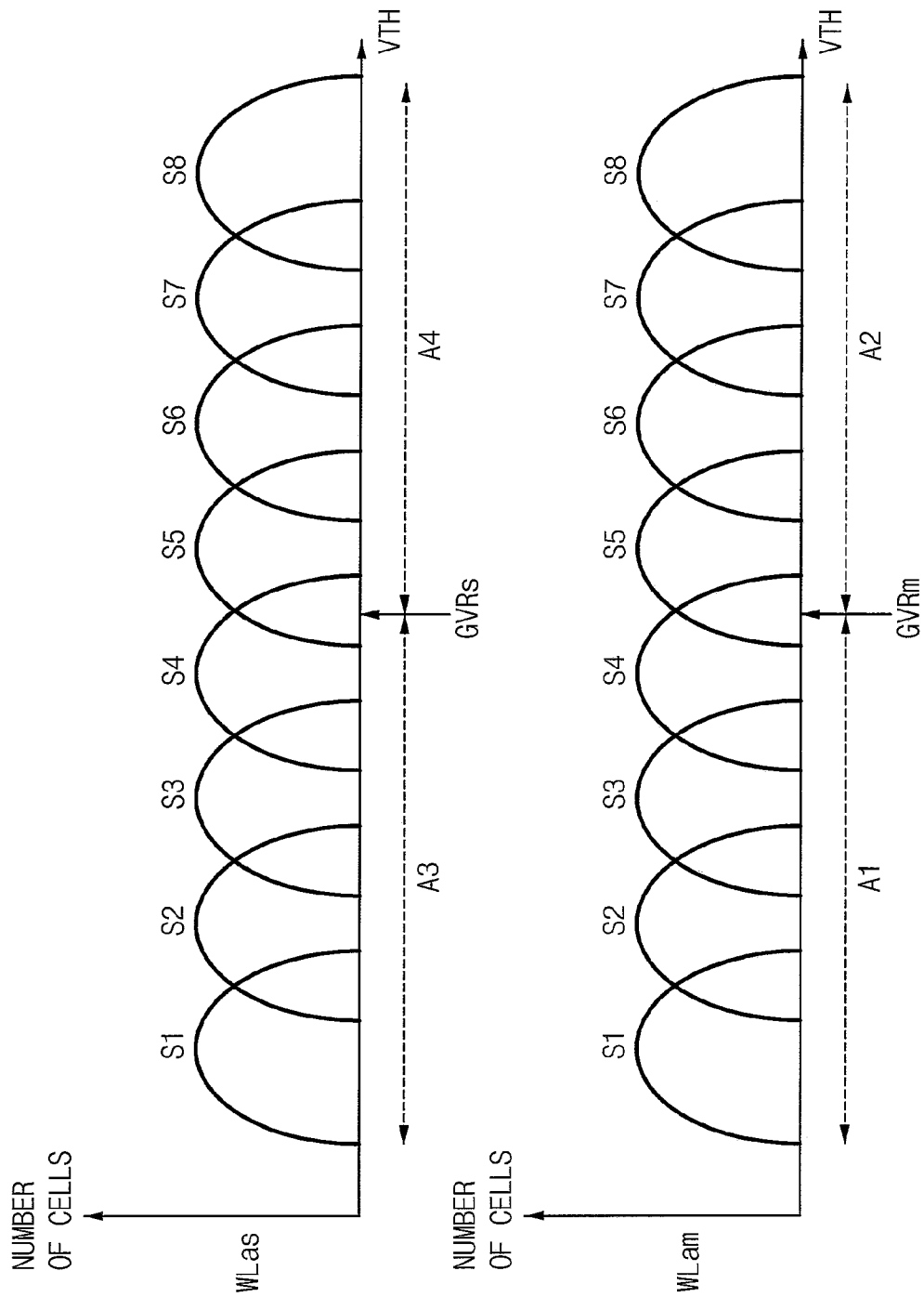

FIGS. 19 and 20 are diagrams illustrating an example embodiment of grouping memory cells in a method of operating a nonvolatile memory device according to example embodiments.

FIG. 19 illustrates a selected wordline WLs and two aggressor wordlines, that is, a main ("first") aggressor wordline WLam adjacent to the selected wordline WLs in a first direction and a sub ("second") aggressor wordline WLas adjacent to the selected wordline WLs in a second direction opposite to the first direction. The selected wordline WLs may include a plurality of selected memory cells C1~C9, the main aggressor wordline WLam may include a plurality of main aggressor memory cells C1'~C9' respectively adjacent to the selected memory cells C1~C9 in the first direction and the sub aggressor wordline WLas may include a plurality of sub aggressor memory cells C1"~C9" respectively adjacent to the selected memory cells C1~C9 in the second direction. As will be described below with reference to FIGS. 23 and 24, the main aggressor wordline WLam may be programmed after the selected wordline WLs is programmed, and the sub aggressor wordline WLas may be programmed before the selected wordline WLs is programmed.

FIG. 20 illustrates an example embodiment in which the main aggressor memory cells C1'~C9' of the main aggressor wordline WLam are grouped into a first group A1 and a second group A2 based on a main grouping read voltage GVRm, and the sub aggressor memory cells C1"~C9" of the sub aggressor wordline WLas are grouped into a third group A3 and a fourth group A4 based on a sub grouping read voltage GVRs.

For example, the main aggressor memory cells C1'~C9' of the main aggressor wordline WLam may affect the selected memory cells C1'~C9' more than the sub aggressor memory cells C1"~C9". In this case, the aggressor memory cells corresponding to the first group A1 and the third group A3 may be grouped into a first aggressor cell group G1', the aggressor memory cells corresponding to the first group A1 and the fourth group A4 may be grouped into a second aggressor cell group G2', the aggressor memory cells corresponding to the second group A2 and the third group A3 may be grouped into a third aggressor cell group G3', and the aggressor memory cells corresponding to the second group A2 and the fourth group A4 may be grouped into a fourth aggressor cell group G4'.

As a result, as illustrated in FIG. 9, the selected memory cells C4, C5 and C8 corresponding to the first aggressor cell group G1' may be grouped into a first selected cell group G1, the selected memory cells C1 and C2 corresponding to the second aggressor cell group G2' may be grouped into a second selected cell group G2, the selected memory cells C3 and C9 corresponding to the third aggressor cell group G3' may be grouped into a third selected cell group G3, and the selected memory cells C2 and C9 corresponding to the fourth aggressor cell group G4' may be grouped into a fourth selected cell group G4.

As described above with reference to FIG. 18, the valley search operations may be performed with respect to each of the plurality of selected cell groups G1~G4, and the plurality of group read voltage sets GVRS1~GVRS4 respectively corresponding to the plurality of selected cell groups G1~G2 may be determined based on the valley search operations. In addition, a plurality of group read operations GRO1~GRO4 may be performed with respect to the plurality of selected cell groups G1~G4 based on the plurality of group read conditions, for example, the plurality of group read voltage sets GRVS1~GRVS4.

Figure 21:
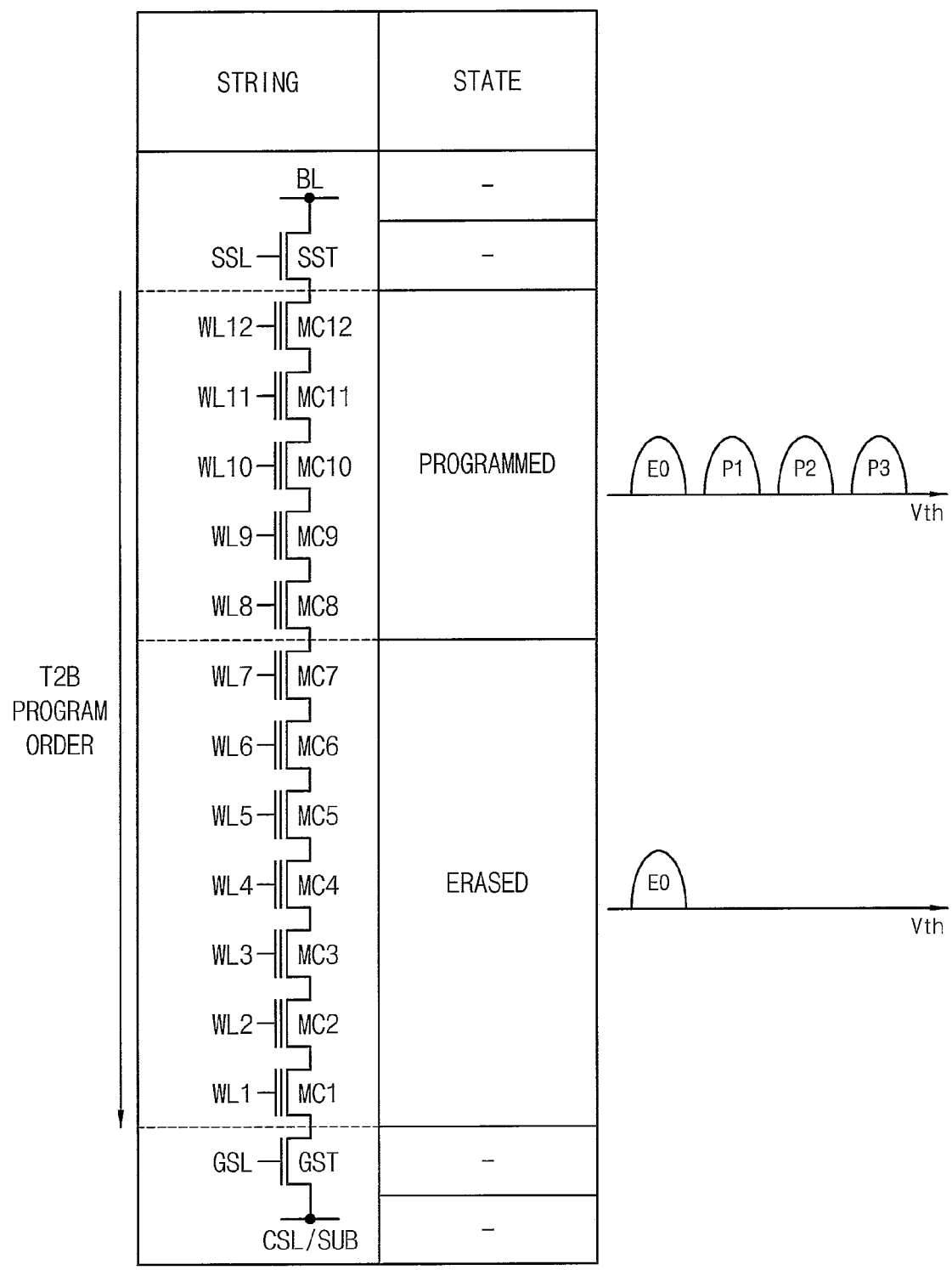
FIGS. 21 and 22 are diagrams illustrating programming operations according to example embodiments.
Figure 22:
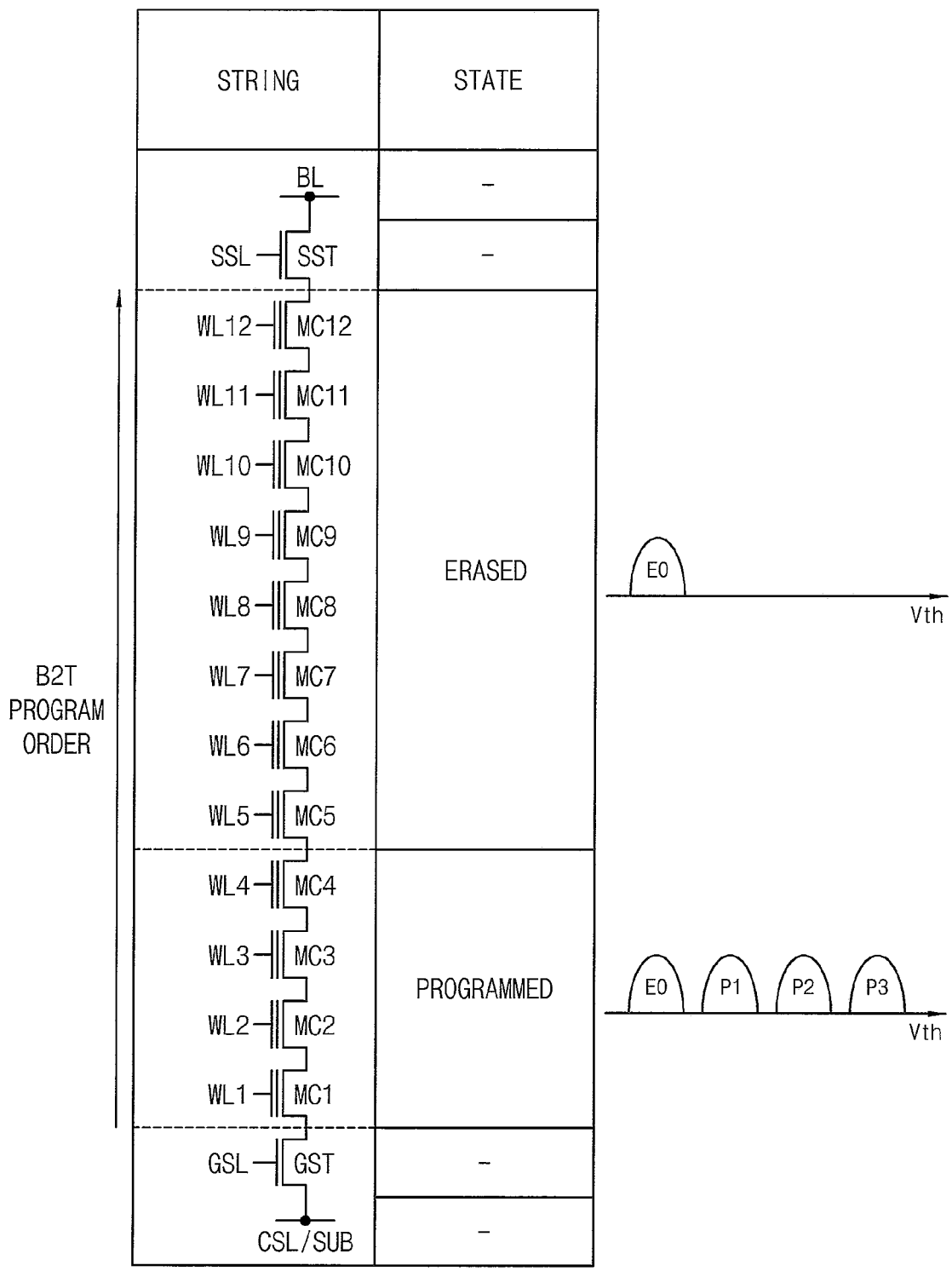

FIGS. 21 and 22 are diagrams illustrating programming operations according to example embodiments.

FIGS. 21 and 22 illustrate one cell string including a string selection transistor SST connected to a string selection line SSL, a ground selection transistor GST connected to a ground selection line GSL and memory cells MC1~MC12 connected to wordlines WL1~WL12 and states of memory cells. The cell string is connected between a bitline BL, a source line CSL and a substrate voltage SUB. FIGS. 21 and 22 illustrate a non-limiting example of twelve memory cells and an MLC storing two bits. The number of the wordlines and the bit number in the memory cell may be determined variously.

Referring to FIG. 21, according to a program scenario of a nonvolatile memory device, a first program may be performed in a downward direction from an uppermost wordline. For example, as the data stored in the memory block increase, the data may be filled in erased cells in the downward direction from top to bottom (T2B program order). The not-programmed memory cells MC1~MC7 are in an erased state E0, and each of the programmed memory cells MC8~MC12 may be in one of the erased state E0 and programmed states P1, P2 and P3.

The three-dimensional NAND flash memory device is more vulnerable to the program disturbance as the size or the critical dimension (CD) of the channel hole is smaller. In case of a multiple level cell (MLC), the bit number programmed in each cell is increased. The number of the program loops is increased due to the increased number of the programmed states and thus the performance degradation due to the program disturbance is increased. Accordingly, the program operation may be performed along the direction of a size decrease of the channel hole, that is, in the T2B program order as illustrated in FIG. 21.

Referring to FIG. 22, according to a program scenario of a nonvolatile memory device, a second program may be performed in an upward direction from a lowest wordline. For example, as the data stored in the memory block increase, the data may be filled in erased cells in the upward direction from bottom to top (B2T program order). The not-programmed memory cells MC5~MC12 are in an erased state E0, and each of the programmed memory cells MC1~MC4 may be in one of the erased state E0 and programmed states P1, P2 and P3.

FIGS. 23 and 24 are diagrams illustrating example embodiments of aggressor wordlines according to the programming operations of FIGS. 21 and 22.

FIG. 23 illustrates an example embodiment corresponding to the first program (T2B program) of FIG. 21. According to the T2B program, the program operations may be performed sequentially in the order of the wordlines WLn+1, WLn, WLn−1 and WLn−2.

In some example embodiments, as a first case CS1, when the wordline WLn is the selected wordline WLs, the wordline WLn−1 adjacent to the selected wordline WLs in the downward direction may be set as the aggressor wordline WLa.

In some example embodiments, as a second case CS2, when the wordline WLn is the selected wordline WLs, the wordline WLn−1 adjacent to the selected wordline WLs in the downward direction may be set as the main aggressor wordline WLam, and the wordline WLn+1 adjacent to the selected wordline WLs in the upward direction may be set as the sub aggressor wordline WLas.

In some example embodiments, as a third case CS3, when the wordline WLn is the selected wordline WLs, the wordline WLn−1 adjacent to the selected wordline WLs in the downward direction may be set as the main aggressor wordline WLam, and the wordline WLn−2 adjacent to the main aggressor wordline WLam in the downward direction may be set as the sub aggressor wordline WLas.

FIG. 24 illustrates an example embodiment corresponding to the second program (B2T program) of FIG. 22. According the B2T program, the program operations may be performed sequentially in the order of the wordlines WLn−1, WLn, WLn+1 and WLn+2.

In some example embodiments, as a fourth case CS4, when the wordline WLn is the selected wordline WLs, the wordline WLn+1 adjacent to the selected wordline WLs in the upward direction may be set as the aggressor wordline WLa.

In some example embodiments, as a fifth case CS5, when the wordline WLn is the selected wordline WLs, the wordline WLn+1 adjacent to the selected wordline WLs in the upward direction may be set as the main aggressor wordline WLam, and the wordline WLn−1 adjacent to the selected wordline WLs in the downward direction may be set as the sub aggressor wordline WLas.

In some example embodiments, as a sixth case CS6, when the wordline WLn is the selected wordline WLs, the wordline WLn+1 adjacent to the selected wordline WLs in the upward direction may be set as the main aggressor wordline WLam, and the wordline WLn+2 adjacent to the main aggressor wordline WLam in the upward direction may be set as the sub aggressor wordline WLas.

Figure 25:
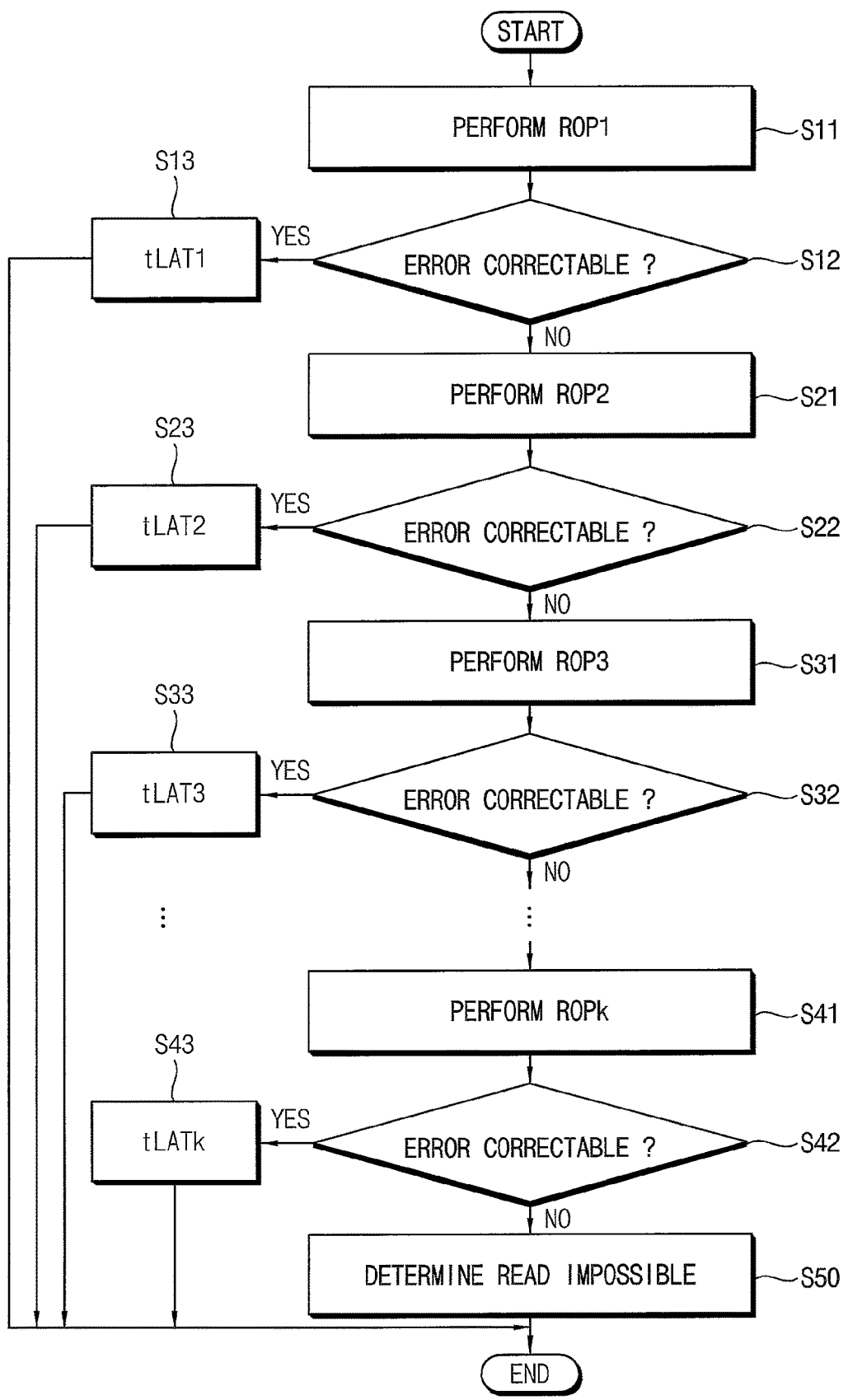
FIG. 25 is a flow chart illustrating a read method based on a read sequence of a nonvolatile memory device according to example embodiments.

FIG. 25 is a flow chart illustrating a read method based on a read sequence of a nonvolatile memory device according to example embodiments.

Referring to FIG. 25, according to the set read sequence RSET, the first read operation ROP1 of the highest priority is performed (S11). Each read operation may include the ECC decoding with respect to the read data. When the error in the read data is correctable by the ECC decoding (S12: YES), the first read time tRD1 of the first read operation ROP1 is determined as the read latency tLAT1 (S13). When the error is correctable, the valid data may be obtained and the read sequence RSEQ is finished.

When the error is not correctable (S12: NO), the second read operation ROP2 of the next priority is performed (S21). When the error in the read data is correctable by the ECC decoding (S22: YES), the sum tRD1+tRD2 of the read times of the first and second read operations ROP1 and ROP2 is determined as the read latency tLAT2 (S23).

When the error is not correctable (S12: NO), the third read operation ROP3 of the next priority is performed (S31). When the error in the read data is correctable by the ECC decoding (S32: YES), the sum tRD1+tRD2+tRD3 of the read times of the first, second and third read operations ROP1, ROP2 and ROP3 is determined as the read latency tLAT3 (S33).

In this way, when the valid data are not obtained through the read operations of the higher priorities, the last read operation ROPk is performed (S41). When the error in the read data is correctable by the ECC decoding (S42: YES), the sum tRD1+tRD2+ . . . +tRDk of the read times of all read operations ROP1~ROPk is determined as the read latency tLATk (S43).

When the valid data are not obtained by the last read operation ROPk, it is determined that the data reading is impossible (S50) and the read sequence RSEQ is finished.

If the operational condition or the operational environment is good, the valid data may be obtained by the first read operation ROP1 for most cases, and thus the read latency may be minimized by setting the read sequence such that the read operation of the shortest read time may be performed first. If the operational condition becomes worse, however, the valid data cannot be obtained by the first read operation for most cases. The later read operations of the next priorities have to be performed and thus the read latency may be increased unnecessarily due to the failure of the first read operation. The performance of the nonvolatile memory device may be enhanced by setting a plurality of read sequences respectively corresponding to the different operational conditions and adaptively controlling the read sequences.

Figure 26:
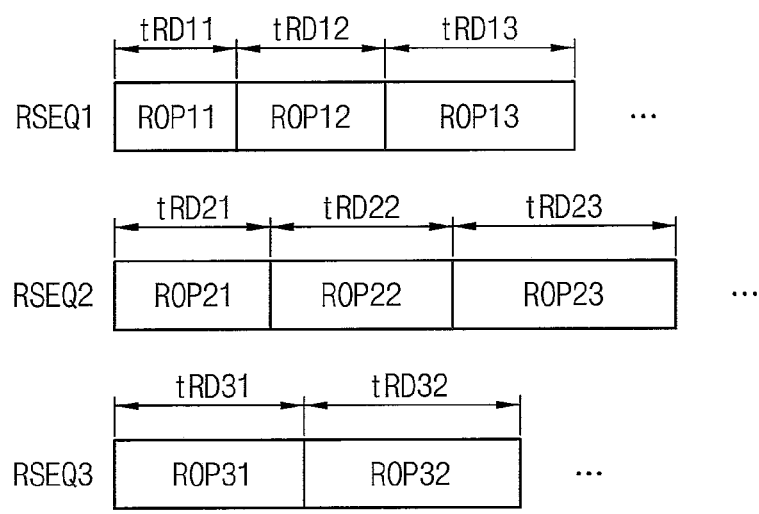
FIG. 26 is a diagram illustrating example embodiments of a read sequence of a nonvolatile memory device according to example embodiments.

FIG. 26 is a diagram illustrating example embodiments of a read sequence of a nonvolatile memory device according to example embodiments.

FIG. 26 illustrates a non-limiting example of three read sequences. However, two read sequences or four or more read sequences may be set according to example embodiments. As described above, each of the first read sequence RSEQ1, the second read sequence RSEQ2 and the third read sequence RSEQ3 may be set such that the read operation having the shorter read time is performed before the read operation having the longer read time.

The read times of the read operations ROP11, ROP12 and ROP13 in the first read sequence RSEQ1 may satisfy the relation tRD11<tRD12<tRD13, the read times of the read operations ROP21, ROP22 and ROP23 in the second read sequence RSEQ2 may satisfy the relation tRD21<tRD22<tRD23, and the read times of the read operations ROP31 and ROP32 in the third read sequence RSEQ3 may satisfy tRD31<tRD32.

In some example embodiments, the first read sequence RSEQ1 may be set such that the first read operation ROP1 having a first read time tRD11 is performed first in the first read sequence RSEQ1, and the second read sequence RSEQ2 may be set such that the second read operation tRD21 having a second read time tRD21 longer than the first read time tRD11 is performed first in the second read sequence RSEQ2. As the probability of read success by the first read operation ROP11 is increased, the first read sequence RSEQ1 is preferable to the second read sequence RSEQ2. In contrast, as the probability of read success by the first read operation ROP11 is decreased, the second read sequence RSEQ2 is preferable to the first read sequence RSEQ1. For example, the first read sequence RSEQ1 is preferable to the second read sequence RSEQ2 as the bit error rate (BER) of the first read sequence RSEQ1 is decreased, and the second read sequence RSEQ2 is preferable to the first read sequence RSEQ1 as the BER of the first read sequence RSEQ1 is increased.

In further example embodiments, the third read sequence RSEQ3 may be set such that a third read operation ROP31 having a third read time tRD31 longer than the second read time tRD21 is performed first in the third read sequence RSEQ3. As the probability of read success by the second read operation ROP21 is increased, the second read sequence RSEQ2 is preferable to the third read sequence RSEQ3. In contrast, as the probability of read success by the second read operation ROP21 is decreased, the third read sequence RSEQ3 is preferable to the second read sequence RSEQ2. For example, the second read sequence RSEQ2 is preferable to the third read sequence RSEQ3 as the BER of the second read sequence RSEQ2 is decreased, and the third read sequence RSEQ3 is preferable to the second read sequence RSEQ2 as the BER of the second read sequence RSEQ2 is increased.

As such, the first read sequence RSEQ1 may be set for the operational condition of the relatively lower range of the BER, the second read sequence RSEQ2 may be set for the operational condition of the intermediate range of the BER, and the third read sequence RSEQ3 may be set for the operational condition of the relatively higher range of the BER.

Figure 27:
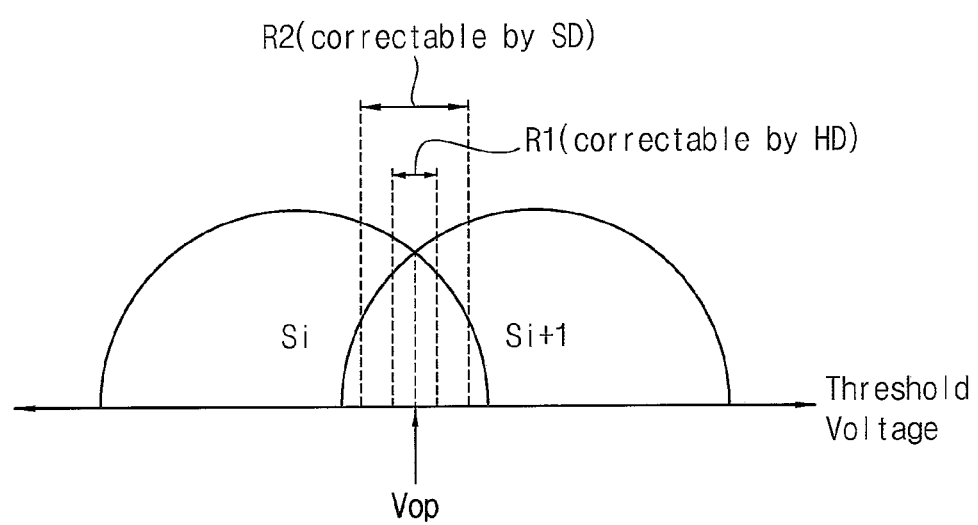
FIG. 27 is a conceptual diagram illustrating a relationship between a predetermined read voltage and an optimal read voltage.

FIG. 27 is a conceptual diagram illustrating a relationship between a predetermined read voltage and an optimal read voltage.

FIG. 27 illustrates threshold voltage distributions of two adjacent states Si and Si+1 in a flash memory device as an example. Hereinafter the example embodiments may be described based on the flash memory device but it can be understood that embodiments of the inventive concept may be applied to other kinds of nonvolatile memory devices. For example, the threshold voltage distributions may be replaced with resistance distributions in case of the resistive memory device and the same method of controlling the read sequence may be applied to the resistive memory device by setting a plurality of read sequences for distinguishing the resistance distributions.

An optimal read voltage Vop is a read voltage leading to a minimum number of error bits among data bits that are read out simultaneously. The optimal read voltage Vop corresponds to a valley, that is, a cross point of the threshold voltage distributions of the two states Si and Si+1. When the distributions are shifted and/or broadened according to change of the operational condition, the difference between the predetermined read voltage and the optimal read voltage increases. As the difference is increased, the BER or the probability of the read fail is increased.

When the predetermined voltage is included in a first voltage range R1, the error in the read data may be corrected by the ECC decoding with hard decision (HD). When the predetermined voltage is included in a second voltage range R2, the error in the read data may be corrected by the ECC decoding with soft decision (SD).

When the bit errors in the read data are too many and the predetermined read voltage is out of the second range R2, the valid data may not be obtained by the ECC decoding. When the valid data are not obtained through the previous read operations based on the predetermined read voltage, a valley search operation may be performed to determine the optimal read voltage Vop and then a read operation may be performed again based on the optimal read voltage. The valley search operation will be further described with reference to FIGS. 33 through 35. Such valley search operation and the read operation based on the optimal read operation may be referred to as a voltage-compensation read operation.

Figure 28:
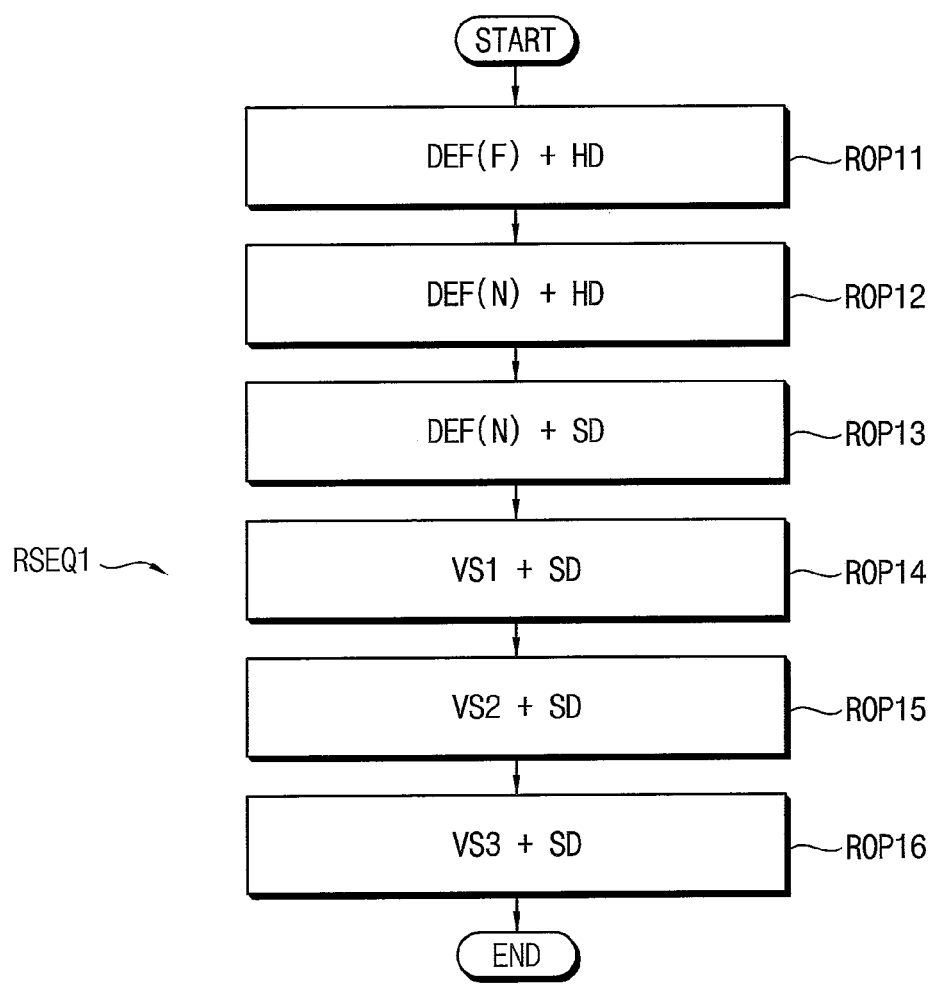
FIGS. 28, 29 and 30 are diagrams illustrating example embodiments of a read sequence of a nonvolatile memory device according to example embodiments.
Figure 29:
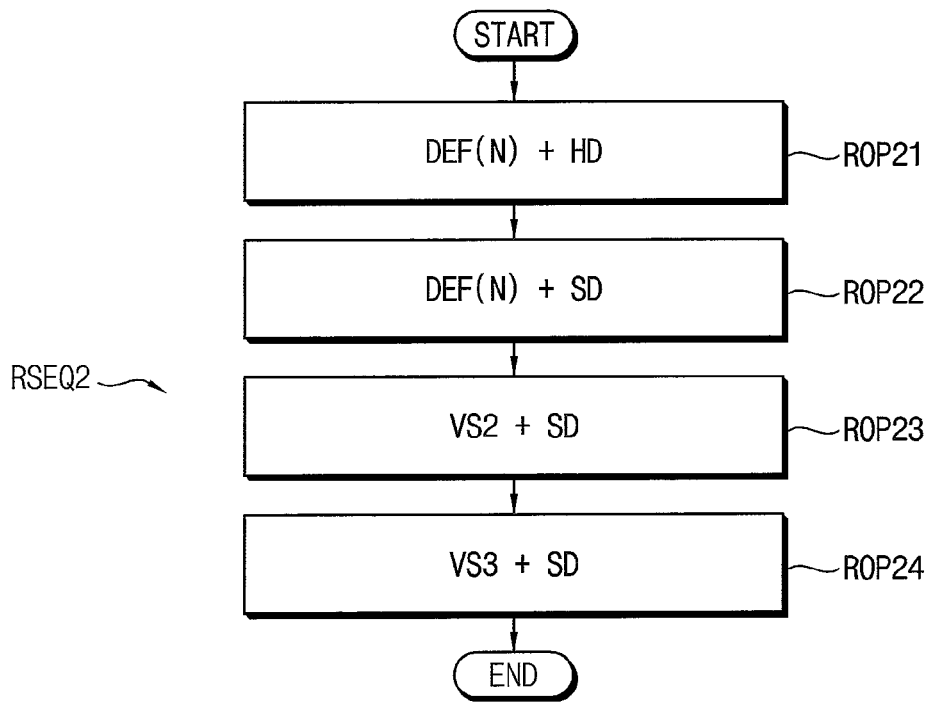
Figure 30:
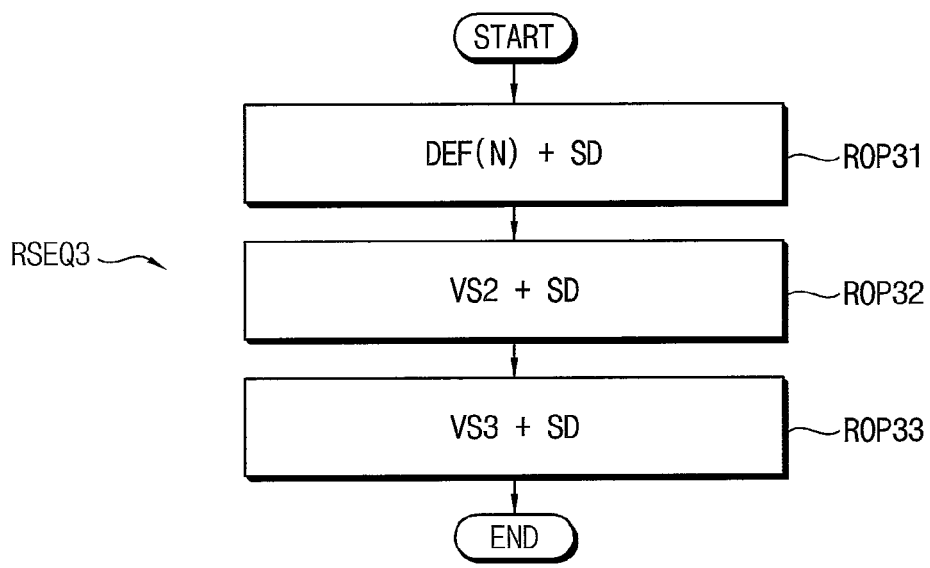

FIGS. 28, 29 and 30 are diagrams illustrating example embodiments of a read sequence of a nonvolatile memory device according to example embodiments.

Referring to FIG. 28, the first read sequence RSEQ1 may include first through sixth read operations ROP11~ROP16, which are arranged according to respective priorities. The first, second and third read operations ROP11, ROP12 and ROP13 may be based on the predetermined read voltage, and the fourth, fifth and sixth read operations ROP14, ROP15 and ROP16 may be the voltage-compensation read operations.

As described above, the read operation having the shorter read time may be performed before the read operation having the longer read time. For example, the priority of the read operations may be higher as the read time is shorter. The first read operation ROP11 having the shortest read time, that is, the first read time tRD11 may be performed first, the second read operation ROP12 having the second read time tRD12 longer than the first read time tRD11 is performed after the first read operation ROP11, and likely the sixth read operation ROP16 having the longest read time tRD16 is performed lastly.

Each of the first and second read operations ROP11 and ROP12 may be a hard decision (HD) read operation that reads out hard decision data using the predetermined read voltage and performs the ECC decoding based on the hard decision data. As will be described with reference to FIGS. 31A, 31B and 32, the first read operation ROP11 may be a fast read operation DEF(F) based on the predetermined read voltage and the second read operation ROP12 may be a normal read operation DEF(N) based on the predetermined read voltage.

The third read operation ROP13 may be a soft decision (SD) read operation that reads out the hard decision data using the predetermined read voltage, provides reliability information of the hard decision data using a plurality of read voltages around the predetermined read voltage, and performs the ECC decoding based on the hard decision data and the reliability information.

The fourth, fifth and sixth read operations ROP14, ROP15 and ROP16 may be the voltage-compensation read operations including the valley search operations VS1, VS2 and VS3 and the read operations based on the detected optimal read voltages, respectively. The valley search operations VS1, VS2 and VS3 may be implemented variously to have different search times and different accuracies.

In some example embodiments, the first valley search operation VS1 may be a valley search operation with respect to all selected memory cells of the selected wordline, and the second and third valley search operations VS2 and VS3 may be the valley search operations with respect to each of the plurality of Selected cell groups according to example embodiments. The number of the aggressor wordlines and/or the number of the aggressor cell groups of the third valley search operation VS3 may be greater than the second valley search operation VS2.

Referring to FIG. 29, the second read sequence RSEQ2 may include first through fourth read operations ROP21~ROP24, which are arranged according to respective priorities. The first and second read operations ROP21 and ROP22 may be based on the predetermined read voltage, and the third and fourth read operations ROP23 and ROP24 may be the voltage-compensation read operations.

As described above, the read operation having the shorter read time may be performed before the read operation having the longer read time. The first read operation ROP21 having the shortest read time, that is, the first read time tRD21 may be performed first, the second read operation ROP22 having the second read time tRD22 longer than the first read time tRD21 is performed after the first read operation ROP21, the third read operation ROP23 having the third read time tRD23 longer than the second read time tRD22 is performed after the second read operation ROP22, and the fourth read operation ROP24 having the longest read time tRD24 is performed lastly. The notations DEF(N), HD, SD, VS2 and VS3 are the same as described with reference to FIG. 28.

Referring to FIG. 30, the third read sequence RSEQ3 may include first, second and third read operations ROP31, ROP32 and ROP33, which are arranged according to respective priorities. The first read operation ROP31 may be based on the predetermined read voltage, and the second and third read operations ROP32 and ROP33 may be the voltage-compensation read operations.

As described above, the read operation having the shorter read time may be performed before the read operation having the longer read time. The first read operation ROP31 having the shortest read time, that is, the first read time tRD31 may be performed first, the second read operation ROP32 having the second read time tRD32 longer than the first read time tRD31 is performed after the first read operation ROP31, and the last read operation ROP33 having the longest read time tRD33 is performed lastly. The notations DEF(N), SD, VS2 and VS3 are the same as described with reference to FIG. 28.

For example, the first read sequence RSEQ1 of FIG. 28 may be set for the operational condition of the relatively lower range of the BER, the second read sequence RSEQ2 of FIG. 29 may be set for the operational condition of the intermediate range of the BER, and the third read sequence RSEQ3 of FIG. 30 may be set for the operational condition of the relatively higher range of the BER. As such, the performance of the nonvolatile memory device may be enhanced by setting a plurality of read sequences respectively corresponding to the different operational conditions and adaptively controlling the read sequences.

Figure 31A:
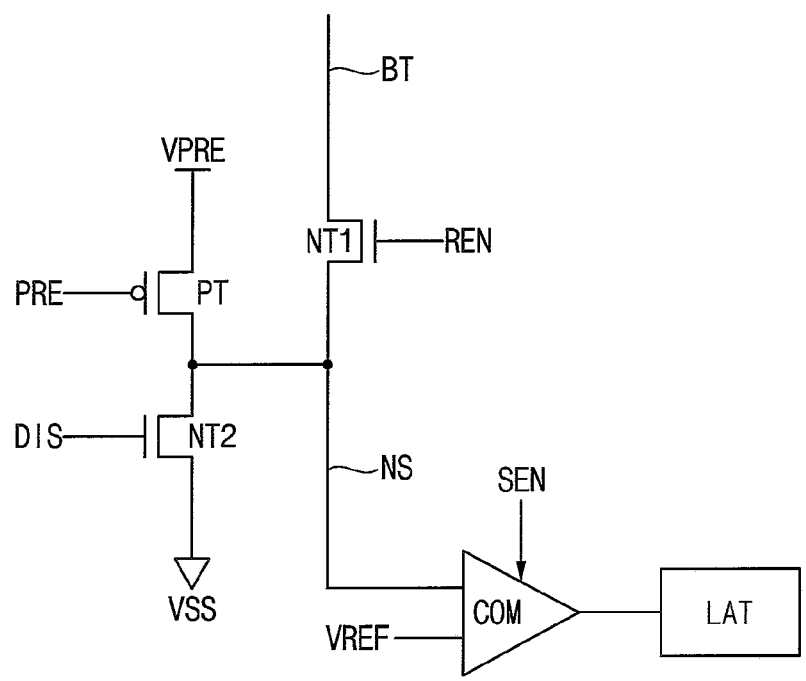

FIGS. 31A, 31B and 32 are diagrams illustrating an example embodiment of determining group read conditions in a method of operating a nonvolatile memory device according to example embodiments.

FIG. 31A illustrates a conceptual configuration of a page buffer and the configuration of the page buffer may be implemented variously. Referring to FIG. 31A, the page buffer may include an enable transistor NT1, a discharge transistor NT2, a precharge transistor PT, a comparator COM and a latch circuit LAT. The enable transistor NT1 may electrically connect a bitline BT and a sensing node NS in response to a read enable signal REN. The discharge transistor NT2 may electrically connect the sensing node NS and a ground voltage VSS in response to a discharge signal DIS. The precharge transistor PT may electrically connect the sensing node NS and a precharge voltage VPRE in response to a precharge signal PRE. The comparator COM may compare a voltage (Vr in FIG. 31B) at the sensing node NS and a reference voltage VREF in response to a sensing enable signal SEN to output a signal indicating the comparison result. The latch circuit LAT may latch the signal output from the comparator COM.

Referring to FIGS. 31A and 32B, when the discharge signal DIS is activated to a logic high level during discharge period t0~t1, the bitline voltage Vr is initialized to a ground voltage. When the precharge signal PRE is activated to a logic low level during precharge period t1~t2, the bitline voltage Vr is charged with the precharge voltage. When the precharge signal PRE is deactivated to a logic high level during develop period t2~t3, the precharge voltage is blocked and the bitline voltage Vr is decreases, where the bitline is connected to the ground voltage through the resistive element of the selected memory cell. The voltage VF1 of the bitline coupled to the off-cell of the relatively higher resistance decreases slowly and the voltage VF0 of the bitline coupled to the on-cell of the relatively lower resistance decreases rapidly.

When the sense enable signal SEN is activated to a logic high level during sense period t3~t4, the bitline voltage VF1 or VF0 is compared with the read voltage VRD and the data bit stored in the selected memory cell may be read out.

FIG. 32 illustrates examples of the fast read operation DEF(F) and the normal read operation DEF(N) which are mentioned in FIG. 28. The data read time may include a discharge time tDIS, a precharge time tPRE, a develop time tDEV and a latching or sensing time tSEN. Even though not illustrated in FIG. 32, the data read time associated with the read latency may further include delay times such as signal transfers between the memory controller and the memory device, address decoding, ECC decoding, etc. The accuracy or reliability of the read data may be enhanced as the precharge time tPRE or the develop time tDEV is increased.

In some example embodiments, determining the plurality of group read conditions (S300) in FIG. 1 may include setting the precharge time tPRE and the develop time tDEV such that at least one of the precharge time tPRE and the develop time tDEV is different between at least two selected cell groups among the plurality of selected cell groups. At least one of the precharge time tPRE and the develop time tDEV may be increased as the threshold voltage of the aggressor cell group corresponding to the selected cell group is increased.

Figure 33:
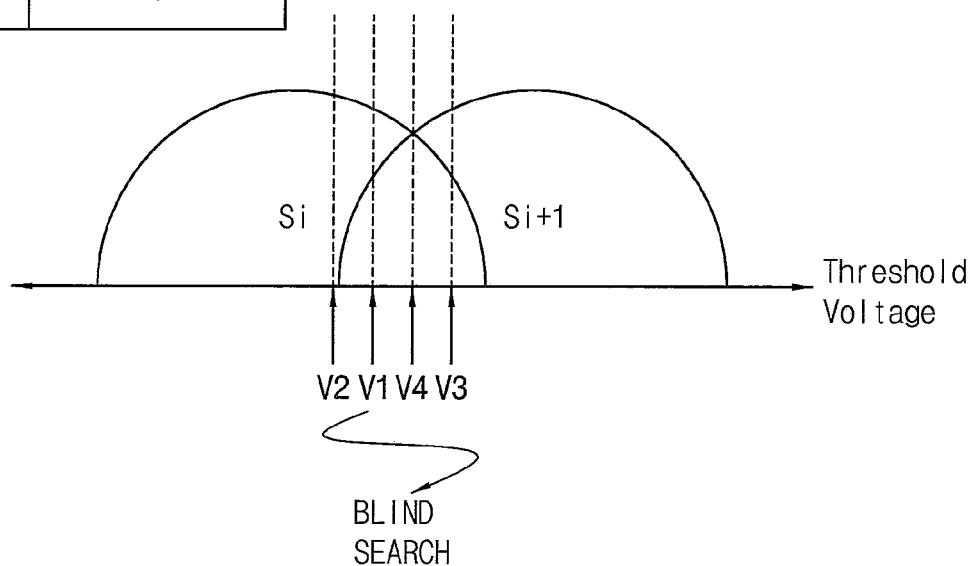
FIGS. 33, 34 and 35 are diagrams illustrating valley search methods according to example embodiments.
Figure 34:
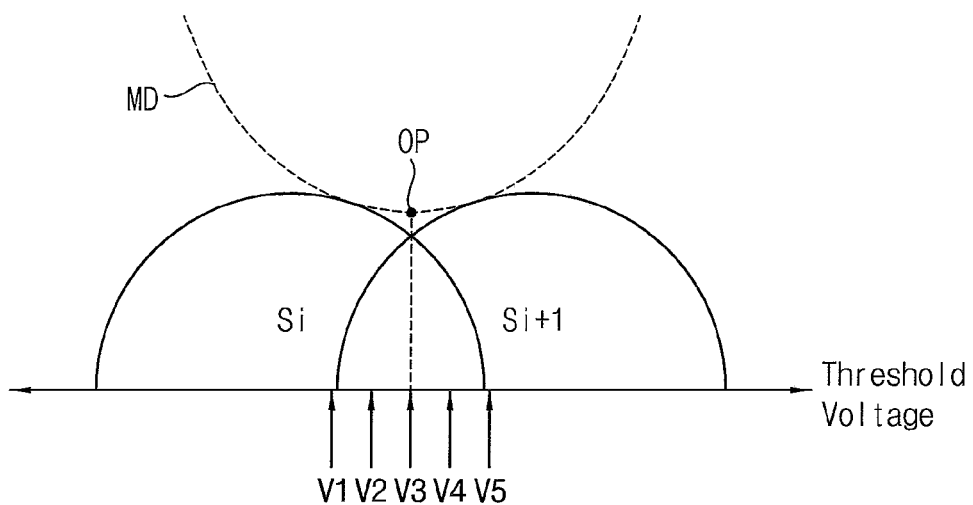
Figure 35:
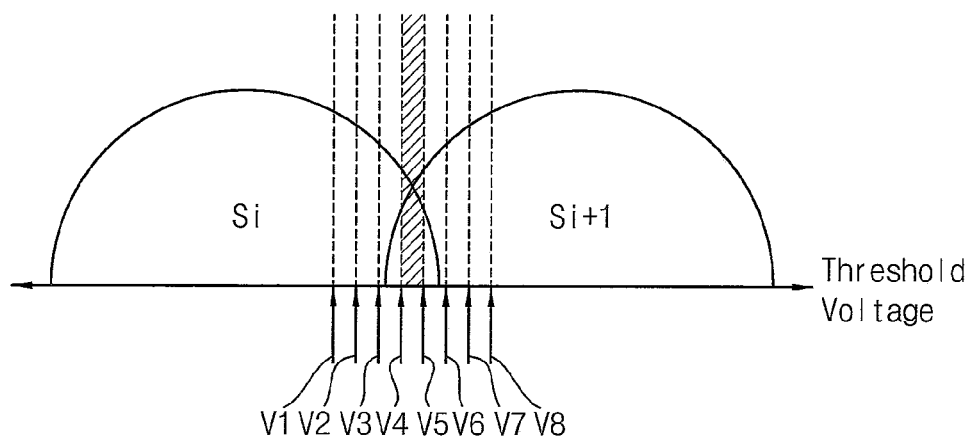

FIGS. 33, 34 and 35 are diagrams illustrating valley search methods according to example embodiments. The valley search methods in FIGS. 33, 34 and 35 are non-limiting examples and the valley search method may be implemented variously.

Referring to FIG. 33, an offset table may be provided by analyzing the shift trends of the memory cells through the various test processes. The valley search method may be performed by referring to the offset table and testing the read voltages V1~V4 having higher probability of valley with a blind searching scheme.

Referring to FIG. 34, the valley search method may be performed by scanning the distributions around the valley using the read voltages VI~VS and modeling the second-order curve MD. The voltage corresponding to the vertex of the modeled curve MD may be determined as the optimal read voltage.

Referring to FIG. 35, the valley search method may be performed by searching the valley point using the read voltages V1~V8 of relatively narrow intervals. The voltage corresponding to a minimum cell number may be determined as the optimal voltage.

The valley search method of FIG. 33 requires the shortest search time but the lowest accuracy. In contrast, the valley search method of FIG. 35 requires the longest search time but the highest accuracy. As such, the plurality of group read voltage sets may be set using the various valley search methods or operations having different searching times and accuracies.

Figure 36:
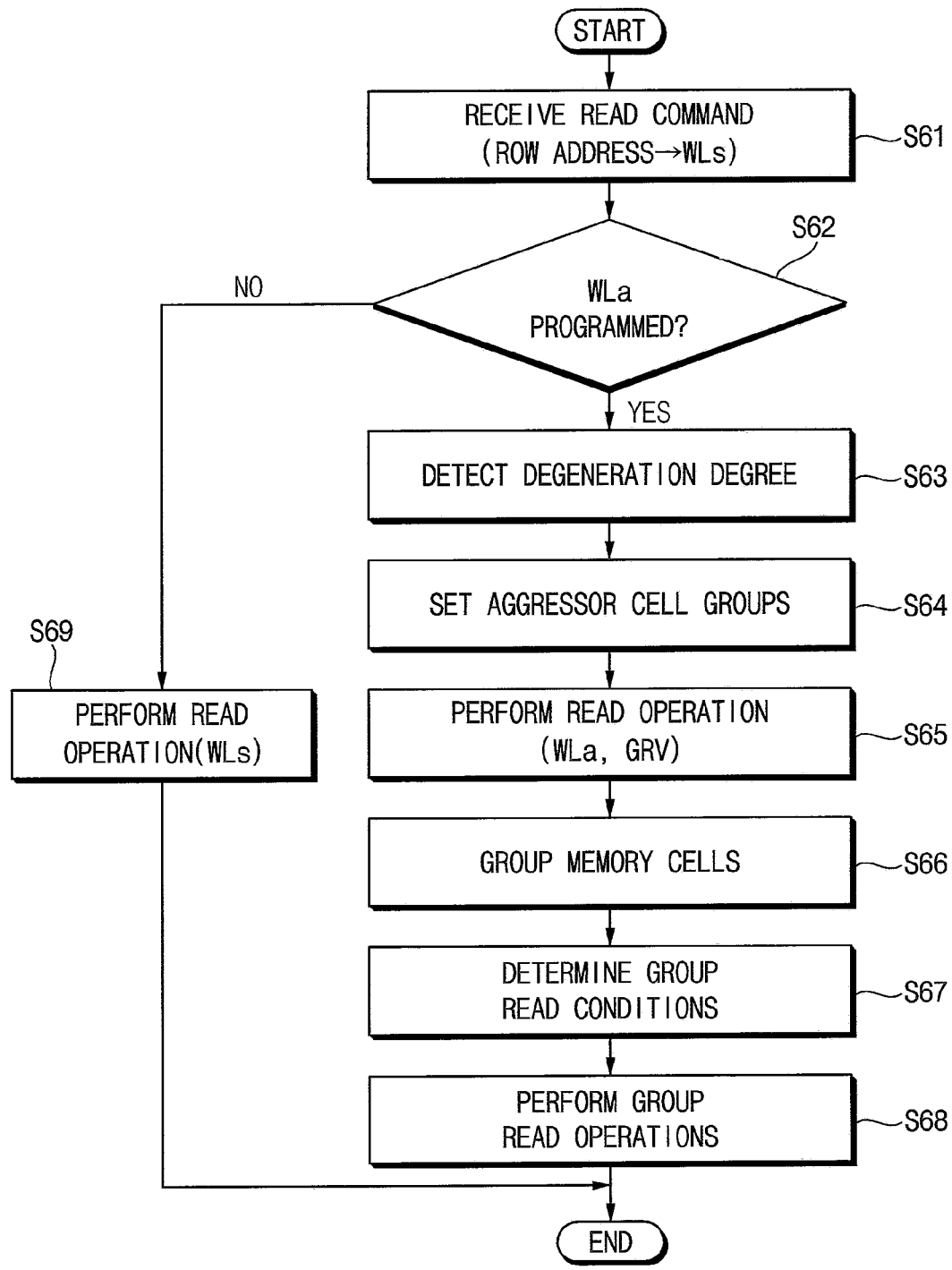
FIG. 36 is a flowchart illustrating a method of operating a nonvolatile memory device according to example embodiments.

FIG. 36 is a flowchart illustrating a method of operating a nonvolatile memory device according to example embodiments.

Referring to FIG. 36, a nonvolatile memory device may receive a read command from a memory controller (S61). The nonvolatile memory device may receive a read address with the read command, and the read address may include a row address indicating a selected wordline WLs.

The nonvolatile memory device may determine whether an aggressor wordline WLa is programmed (S62). When the aggressor wordline WLa is not programmed (S62: NO), the nonvolatile memory device may perform a read operation with respect to all selected memory cells of the selected wordline WLs (S69).

When the aggressor wordline WLa is programmed (S62: YES), the nonvolatile memory device may detect a degeneration degree of retention characteristics of the memory block (S63), and set the plurality of aggressor cell groups based on the degeneration degree (S64). Example embodiments of setting the plurality of aggressor cell groups will be described with reference to FIGS. 37 and 38.

The nonvolatile memory device may perform a read operation with respect to the aggressor wordline WLa based on one or more grouping read voltages GRV (S65), and group the memory cells based on the result of the read operation (S66). As described above, the grouping may include grouping the aggressor memory cells of the aggressor wordline WLa into a plurality of aggressor cell groups and grouping of the selected memory cells of the selected wordline WLs into the plurality of selected cell groups.

The nonvolatile memory device may determine a plurality of group read conditions respectively corresponding to the plurality of selected cell groups (S67) and perform a plurality of group read operations with respect to the plurality of selected cell groups based on the plurality of group read conditions (S68), as described above.

Figure 37:
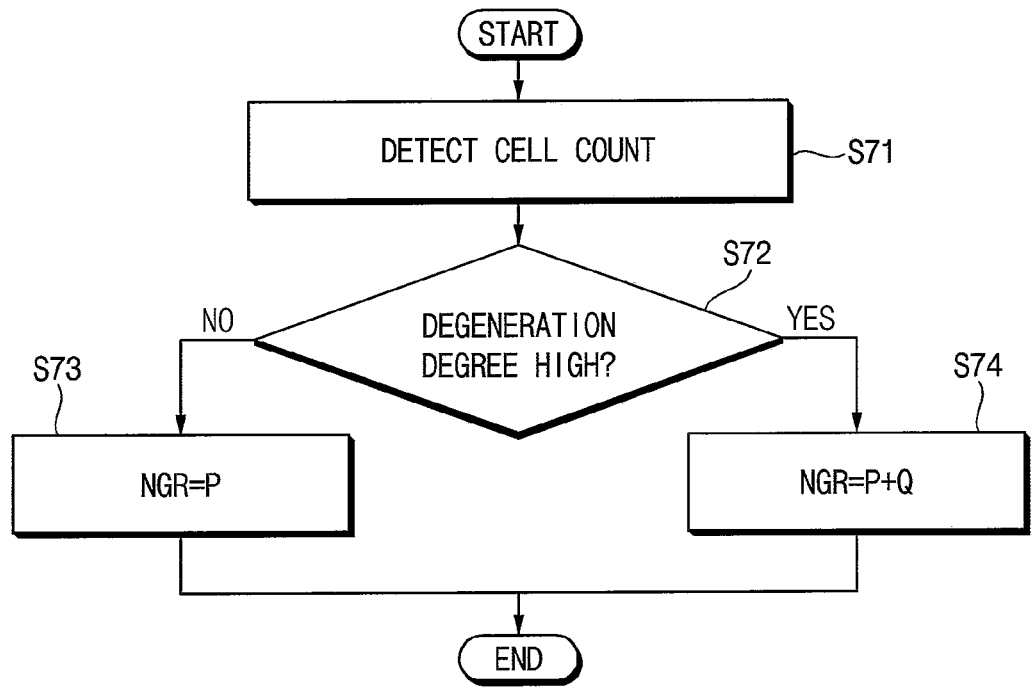
FIGS. 37, 38 and 39 are diagrams illustrating example embodiment of setting aggressor cell groups in a method of operating a nonvolatile memory device according to example embodiments.
Figure 38:
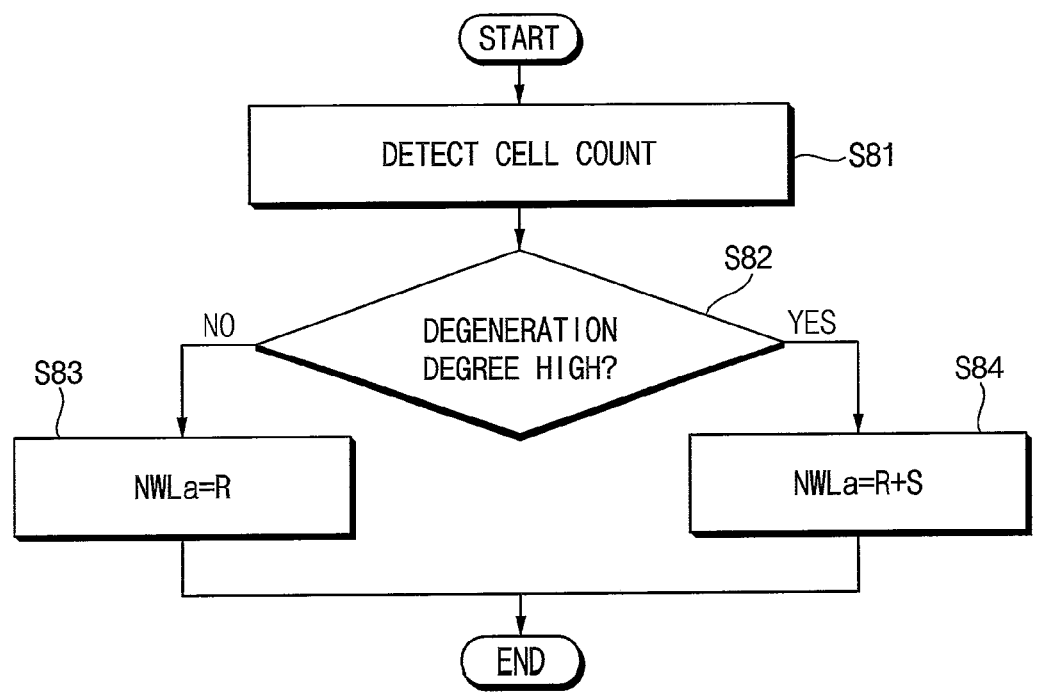
Figure 39:
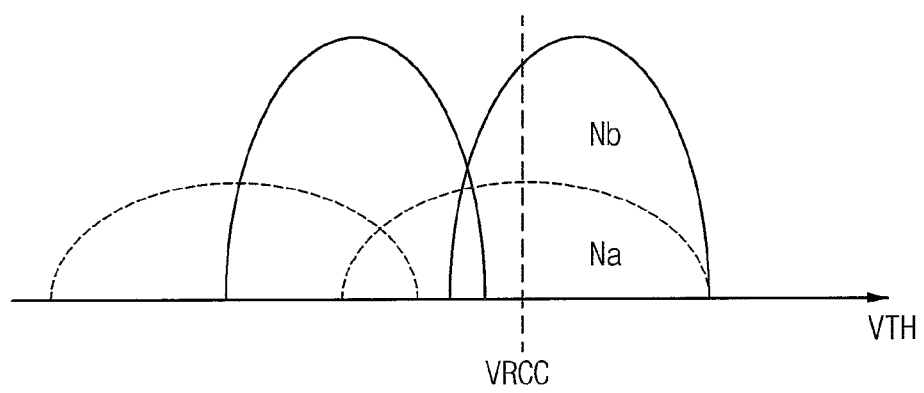

FIGS. 37, 38 and 39 are diagrams illustrating example embodiments of setting aggressor cell groups in a method of operating a nonvolatile memory device according to example embodiments.

Referring to FIG. 37, the control circuit 550 in FIG. 3 may detect a cell count of a memory block in which the selected wordline WLs is included (S71). The control circuit 550 may determine the degeneration degree of the retention characteristics of the memory block based on the cell count (S72). When the degeneration degree is not high (e.g., not higher than a predetermined value) (S72: NO), the control circuit 500 may determine the number NGR of the aggressor cell groups to be P (S73), where P is a positive integer. When the degeneration degree is high (e.g., higher than a predetermined value) (S72: YES), the control circuit 500 may determine the number NGR of the aggressor cell groups to be P+Q (S74), where Q is a positive integer.

As such, the number NGR of the aggressor cell groups may be determined based on the degeneration degree. The number NGR of the plurality of aggressor cell groups may be increased by increasing the number of the grouping read voltages as the degeneration degree increases. For example, the number NGR may be determined to be two as described with reference to FIGS. 8 through 10 when the degeneration degree is not high (S72: NO). In contrast, the number NGR may be determined to be four as described with reference to FIGS. 15 through 17 when the degeneration degree is high (S72: YES).

Referring to FIG. 38, the control circuit 550 in FIG. 3 may detect a cell count of a memory block in which the selected wordline WLs is included (S81). The control circuit 550 may determine the degeneration degree of the retention characteristics of the memory block based on the cell count (S82). When the degeneration degree is not high (e.g., not higher than a predetermined value) (S72: NO), the control circuit 500 may determine the number NWLa of the aggressor wordlines to be R (S83), where R is a positive integer. When the degeneration degree is high (e.g., higher than a predetermined value) (S82: YES), the control circuit 500 may determine the number NWLa of the aggressor wordlines to be R+S (S84), where R is a positive integer.

As such, the number NWLa of the aggressor wordlines may be determined based on the degeneration degree. The number NWLa of the aggressor wordlines may be increased as the degeneration degree increases. For example, the number NWLa may be determined to be one as the first and fourth cases CS1 and CS4 of FIGS. 23 and 24 when the degeneration degree is not high (S82: NO). In contrast, the number NWLa may be determined to be two as the second, third, fifth and sixth cases CS2, CS3, CS5 and CS6 of FIGS. 23 and 24 when the degeneration degree is high (S82: YES).

FIG. 39 illustrates two adjacent states. The solid lines indicate a case corresponding to the relatively lower degeneration degree of the retention characteristics of a memory block and the dotted lines indicate a case corresponding to the relatively higher degeneration degree of the retention characteristics of a memory block. As the degeneration decree increases, the threshold voltage distribution may be broadened and decreased.

For example, a read operation may be performed with respect to one wordline based on a cell count read voltage VRCC to detect a cell count, where the cell count corresponds to a number of on cells or a number of off cells among memory cells of the memory block. FIG. 39 illustrates an example in which the cell count corresponds to the number of off cells. In this case, as illustrated in FIG. 39, the cell count Na corresponding to the relatively higher degeneration degree may be greater than the cell count corresponding to the relatively lower degeneration degree.

In some example embodiments, the wordline for detecting the cell count may be a wordline at a predetermined position in the memory block. In this case, the cell count may be commonly applied regardless of the selected wordline for the read operation and the same grouping method may be applied with respect to all of the wordlines in the memory block.

In some example embodiments, the wordline for detecting the cell count may be the aggressor wordline adjacent to the selected wordline. In this case, the cell count may be varied depending on the read address or the selected wordline and the grouping method may be varied depending on the selected wordline. Here, the grouping method indicates the number of the aggressor cell groups as described with reference to FIG. 37 and/or the number of the aggressor wordlines as described with reference to FIG. 38.

As such, the cell count may be detected based on one or more cell count read voltages, and the degeneration degree of the memory block may be determined based on the cell count.

Figure 40:
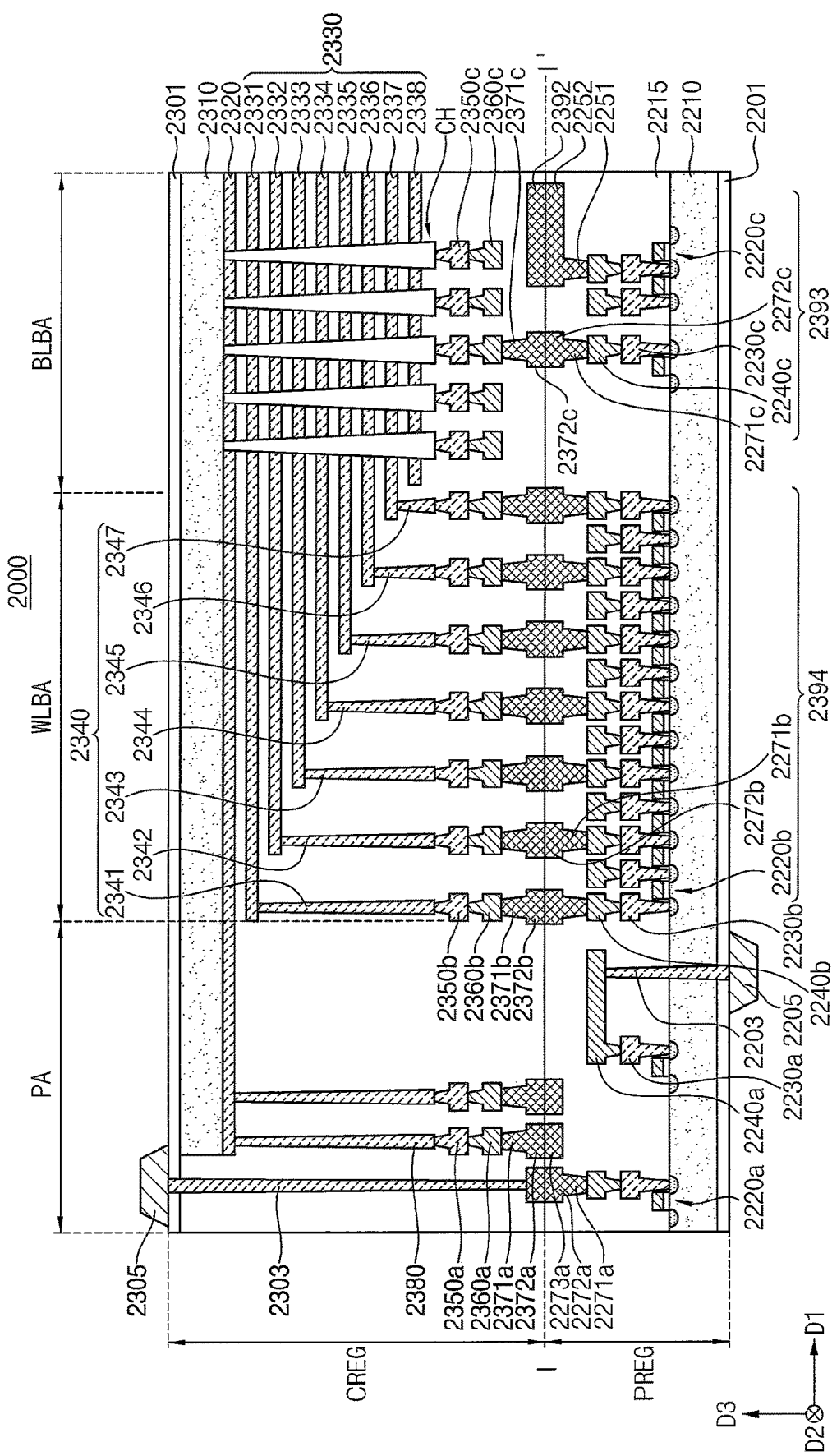
FIG. 40 is a cross-sectional diagram illustrating a nonvolatile memory device according to example embodiments.

FIG. 40 is a cross-sectional diagram illustrating a nonvolatile memory device according to example embodiments.

Referring to FIG. 40, a nonvolatile memory device 2000 may have a chip-to-chip (C2C) structure. Here, the term "C2C structure" denotes a structure in which an upper chip includes a memory cell region (e.g., the cell region CREG) on a first wafer, and a lower chip includes a peripheral circuit region (e.g., the peripheral region PREG) on a second wafer, in which the upper chip and the lower chip are bonded (or mounted) together at a bonding surface I-I'. In this regard, the bonding process may include a method of electrically connecting a bonding metal formed on an uppermost metal layer of the upper chip and a bonding metal formed on an uppermost metal layer of the lower chip. For example, when the bonding metals include copper (Cu), Cu-to-Cu bonding may be utilized. Example embodiments, however, are not limited thereto. For example, the bonding metals may also be formed of aluminum (Al) or tungsten (W).

Each of the peripheral region PREG and the cell region CREG of the nonvolatile memory device 2000 may include an external pad bonding area PA, a wordline bonding area WLBA, and a bitline bonding area BLBA.

The peripheral region PREG may include a first substrate 2210, an interlayer insulating layer 2215, circuit elements 2220a, 2220b, and 2220c formed on the first substrate 2210, first metal layers 2230a, 2230b, and 2230c respectively connected to the circuit elements 2220a, 2220b, and 2220c, and second metal layers 2240a, 2240b, and 2240c formed on the first metal layers 2230a, 2230b, and 2230c. In some embodiments, the first metal layers 2230a, 2230b, and 2230c may be formed of tungsten having relatively high electrical resistivity, and the second metal layers 2240a, 2240b, and 2240c may be formed of copper having relatively low electrical resistivity.

In some embodiments, such as the embodiment of FIG. 40, although only the first metal layers 2230a, 2230b, and 2230c and the second metal layers 2240a, 2240b, and 2240c are shown and described, example embodiments are not limited thereto. For example, in some embodiments, one or more additional metal layers may be further formed on the second metal layers 2240a, 2240b, and 2240c. At least a portion of the one or more additional metal layers formed on the second metal layers 2240a, 2240b, and 2240c may be formed of, for example, aluminum or the like having a lower electrical resistivity than those of copper forming the second metal layers 2240a, 2240b, and 2240c.

The interlayer insulating layer 2215 may be disposed on the first substrate 2210 and cover the circuit elements 2220a, 2220b, and 2220c, the first metal layers 2230a, 2230b, and 2230c, and the second metal layers 2240a, 2240b, and 2240c. The interlayer insulating layer 2215 may include or may be formed of an insulating material such as, for example, silicon oxide, silicon nitride, or the like.

Lower bonding metals 2271b and 2272b may be formed on the second metal layer 2240b in the wordline bonding area WLBA. In the wordline bonding area WLBA, the lower bonding metals 2271b and 2272b in the peripheral region PREG may be electrically bonded to upper bonding metals 2371b and 2372b of the cell region CREG. The lower bonding metals 2271b and 2272b and the upper bonding metals 2371b and 2372b may be formed of, for example, aluminum, copper, tungsten, or the like. The upper bonding metals 2371b and 2372b in the cell region CREG may be referred to as first metal pads, and the lower bonding metals 2271b and 2272b in the peripheral region PREG may be referred to as second metal pads.

The cell region CREG may include at least one memory block. The cell region CREG may include a second substrate 2310 and a common source line 2320. On the second substrate 2310, wordlines 2331, 2332, 2333, 2334, 2335, 2336, 2337, and 2338 (collectively, 2330) may be vertically stacked (in the direction D3 or a Z-axis) perpendicular to an upper surface of the second substrate 2310. At least one string selection line and at least one ground selection line may be arranged on and below the wordlines 2330, respectively, and the wordlines 2330 may be disposed between the at least one string selection line and the at least one ground selection line.

In the bitline bonding area BLBA, a channel structure CH may vertically extend perpendicular to the upper surface of the second substrate 2310, and pass through the wordlines 2330, the at least one string selection line, and the at least one ground selection line. The channel structure CH may include, for example, a data storage layer, a channel layer, a buried insulating layer, and the like. The channel layer may be electrically connected to a first metal layer 2350c and a second metal layer 2360c. For example, the first metal layer 2350c may be a bitline contact, and the second metal layer 2360c may be a bitline. In an example embodiment, the bitline (the second metal layer 2360c) may extend in a second horizontal direction D2 (e.g., a Y-axis direction) parallel to the upper surface of the second substrate 2310.

In the illustrated example of FIG. 40, an area in which the channel structure CH, the bitline (the second metal layer 2360c), and the like are disposed may be defined as the bitline bonding area BLBA. In the bitline bonding area BLBA, the bitline (the second metal layer 2360c) may be electrically connected to the circuit elements 2220c providing a page buffer 2393 in the peripheral region PREG. The bitline (the second metal layer 2360c) may be connected to upper bonding metals 2371c and 2372c in the cell region CREG, and the upper bonding metals 2371c and 2372c may be connected to lower bonding metals 2271c and 2272c connected to the circuit elements 2220c of the page buffer 2393.

In the wordline bonding area WLBA, the wordlines 2330 may extend in a first horizontal direction D1 (e.g., an X-axis direction) parallel to the upper surface of the second substrate 2310 and perpendicular to the second horizontal direction D2, and may be connected to cell contact plugs 2341, 2342, 2343, 2344, 2345, 2346, and 2347 (collectively, 2340). The wordlines 2330 and the cell contact plugs 2340 may be connected to each other in pads provided by at least a portion of the wordlines 2330 extending in different lengths in the first horizontal direction D1. A first metal layer 2350b and a second metal layer 2360b may be connected to an upper portion of the cell contact plugs 2340 connected to the wordlines 2330, sequentially. The cell contact plugs 2340 may be connected to the peripheral region PREG by the upper bonding metals 2371b and 2372b of the cell region CREG and the lower bonding metals 2271b and 2272b of the peripheral region PREG in the wordline bonding area WLBA.

The cell contact plugs 2340 may be electrically connected to the circuit elements 2220b forming a row decoder 2394 in the peripheral region PREG. In an example embodiment, operating voltages of the circuit elements 2220b forming the row decoder 2394 may be different than operating voltages of the circuit elements 2220c forming the page buffer 2393. For example, operating voltages of the circuit elements 2220c forming the page buffer 2393 may be greater than operating voltages of the circuit elements 2220b forming the row decoder 2394.

A common source line contact plug 2380 may be disposed in the external pad bonding area PA. The common source line contact plug 2380 may be formed of a conductive material such as, for example, a metal, a metal compound, polysilicon, or the like, and may be electrically connected to the common source line 2320. A first metal layer 2350a and a second metal layer 2360a may be stacked on an upper portion of the common source line contact plug 2380, sequentially. For example, an area in which the common source line contact plug 2380, the first metal layer 2350a, and the second metal layer 2360a are disposed may be defined as the external pad bonding area PA.

I/O pads 2205 and 2305 may be disposed in the external pad bonding area PA. A lower insulating film 2201 covering a lower surface of the first substrate 2210 may be formed below the first substrate 2210, and a first I/O pad 2205 may be formed on the lower insulating film 2201. The first I/O pad 2205 may be connected to at least one of the circuit elements 2220a, 2220b, and 2220c disposed in the peripheral region PREG through a first I/O contact plug 2203, and may be separated from the first substrate 2210 by the lower insulating film 2201. In addition, a side insulating film may be disposed between the first I/O contact plug 2203 and the first substrate 2210 to electrically separate the first I/O contact plug 2203 and the first substrate 2210.

An upper insulating film 2301 covering the upper surface of the second substrate 2310 may be formed on the second substrate 2310, and a second I/O pad 2305 may be disposed on the upper insulating film 2301. The second I/O pad 2305 may be connected to at least one of the circuit elements 2220a, 2220b, and 2220c disposed in the peripheral region PREG through a second I/O contact plug 2303. In some embodiments, the second I/O pad 2305 is electrically connected to a circuit element 2220a.

In some embodiments, the second substrate 2310 and the common source line 2320 are not disposed in an area in which the second I/O contact plug 2303 is disposed. Also, in some embodiments, the second I/O pad 2305 does not overlap the wordlines 2330 in the vertical direction D3 (e.g., the Z-axis direction). The second I/O contact plug 2303 may be separated from the second substrate 2310 in the direction parallel to the upper surface of the second substrate 310, and may pass through the interlayer insulating layer 2315 of the cell region CREG to be connected to the second I/O pad 2305.

According to embodiments, the first I/O pad 2205 and the second I/O pad 2305 may be selectively formed. For example, in some embodiments, the nonvolatile memory device 2000 may include only the first I/O pad 2205 disposed on the first substrate 2210 or the second I/O pad 2305 disposed on the second substrate 2310. Alternatively, in some embodiments, the memory device 200 may include both the first I/O pad 2205 and the second I/O pad 2305.

A metal pattern provided on an uppermost metal layer may be provided as a dummy pattern or the uppermost metal layer may be absent, in each of the external pad bonding area PA and the bitline bonding area BLBA, respectively included in the cell region CREG and the peripheral region PREG.

In the external pad bonding area PA, the nonvolatile memory device 2000 may include a lower metal pattern 2273a, corresponding to an upper metal pattern 2372a formed in an uppermost metal layer of the cell region CREG, and having the same cross-sectional shape as the upper metal pattern 2372a of the cell region CREG so as to be connected to each other, in an uppermost metal layer of the peripheral region PREG. In some embodiments, in the peripheral region PREG, the lower metal pattern 2273a formed in the uppermost metal layer of the peripheral region PREG is not connected to a contact. In similar manner, in the external pad bonding area PA, an upper metal pattern 2372a, corresponding to the lower metal pattern 2273a formed in an uppermost metal layer of the peripheral region PREG, and having the same shape as a lower metal pattern 2273a of the peripheral region PREG, may be formed in an uppermost metal layer of the cell region CREG.

The lower bonding metals 2271b and 2272b may be formed on the second metal layer 2240b in the wordline bonding area WLBA. In the wordline bonding area WLBA, the lower bonding metals 2271b and 2272b of the peripheral region PREG may be electrically connected to the upper bonding metals 2371b and 2372b of the cell region CREG by, for example, Cu-to-Cu bonding.

Further, in the bitline bonding area BLBA, an upper metal pattern 2392, corresponding to a lower metal pattern 2252 formed in the uppermost metal layer of the peripheral region PREG, and having the same cross-sectional shape as the lower metal pattern 2252 of the peripheral region PREG, may be formed in an uppermost metal layer of the cell region CREG. In some embodiments, a contact is not formed on the upper metal pattern 2392 formed in the uppermost metal layer of the cell region CREG.

Figure 41:
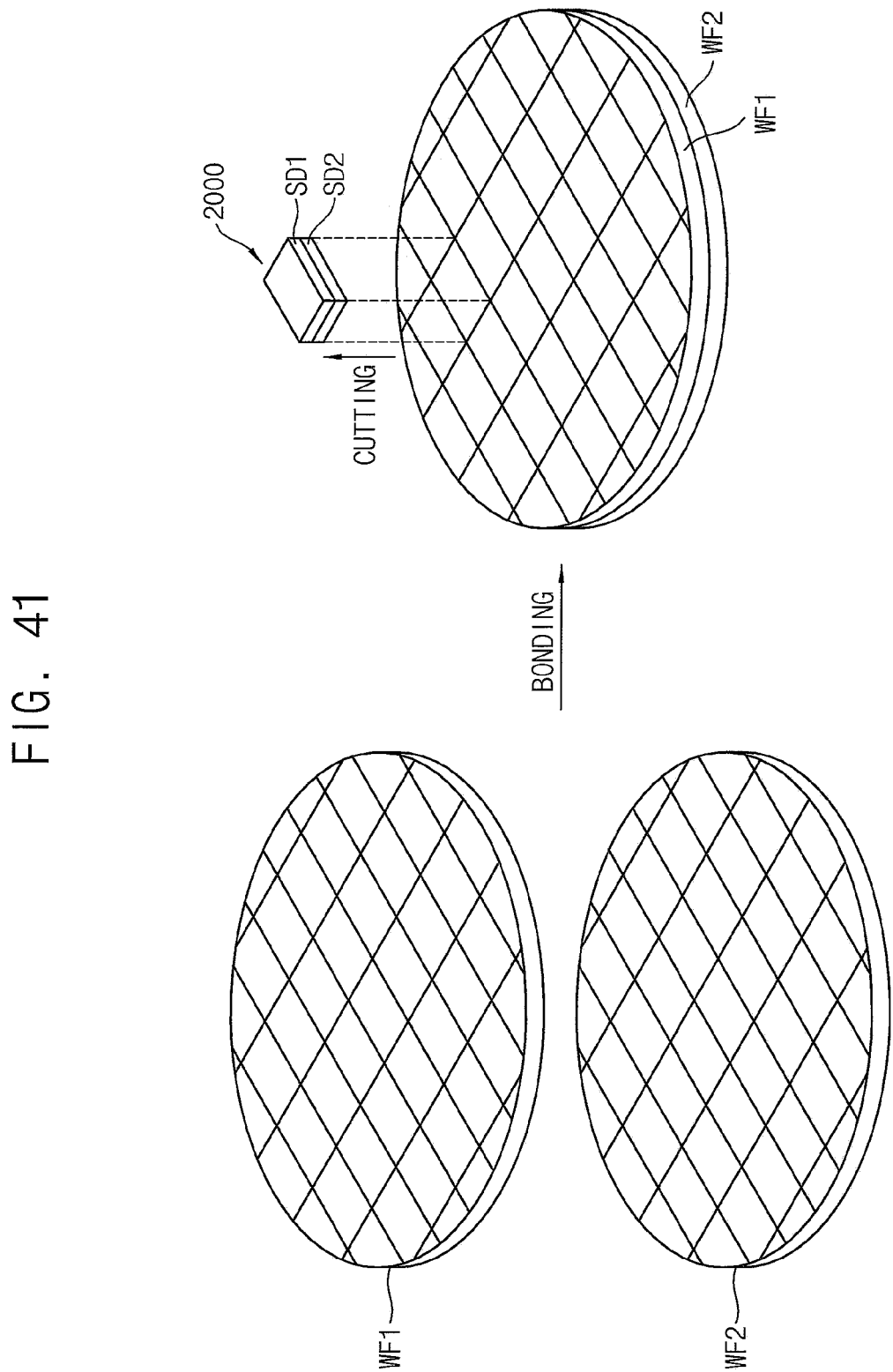
FIG. 41 is a conceptual diagram illustrating manufacturing processes of a stacked semiconductor device according to example embodiments.

FIG. 41 is a conceptual diagram illustrating manufacturing processes of a stacked semiconductor device according to example embodiments.

Referring to FIG. 41, respective integrated circuits may be formed on a first wafer WF1 and a second wafer WF2. The memory cell array may be formed in the first wafer WF1 and the peripheral circuits may be formed in the second wafer WF2.

After the various integrated circuits have been respectively formed on the first and second wafers WF1 and WF2, the first wafer WF1 and the second wafer WF2 may be bonded together. The bonded wafers WF1 and WF2 may then be cut (or divided) into separate chips, in which each chip corresponds to a semiconductor device such as, for example, the nonvolatile memory device 2000, including a first semiconductor die SD1 and a second semiconductor die SD2 that are stacked vertically (e.g., the first semiconductor die SD1 is stacked on the second semiconductor die SD2, etc.). Each cut portion of the first wafer WF1 corresponds to the first semiconductor die SD1 and each cut portion of the second wafer WF2 corresponds to the second semiconductor die SD2.

Figure 42:
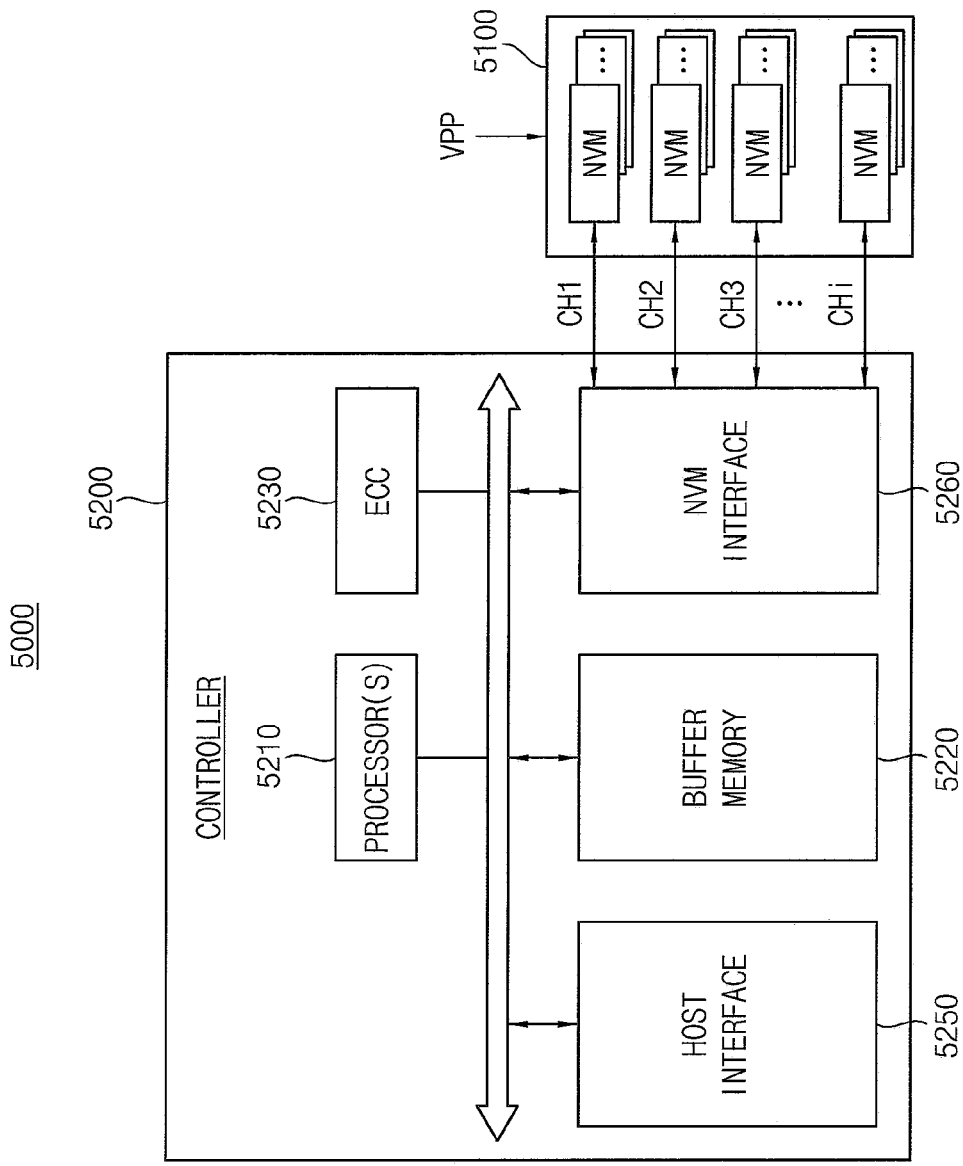
FIG. 42 is a block diagram illustrating a solid state or solid state drive (SSD) according to example embodiments.

FIG. 42 is a block diagram illustrating a solid state or solid state drive (SSD) according to example embodiments.

Referring to FIG. 42, an SSD 5000 may generally include nonvolatile memory devices 5100 and an SSD controller 5200.

The nonvolatile memory devices 5100 may (optionally) be configured to receive a high voltage VPP. One or more of the nonvolatile memory devices 5100 may be provided as memory device(s) according to embodiments of the inventive concept described above. Accordingly, the nonvolatile memory devices 5100 may reduce or prevent soft erase of the unselected memory block by preventing the precharge of the unselected memory block BLK while the channels of the selected memory block are precharged.

The SSD controller 5200 is connected to the nonvolatile memory devices 5100 via multiple channels CH1, CH2, CHI3, ... Chi, in which i is a natural number. The SSD controller 1200 includes one or more processors 5210, a buffer memory 5220, an error correction code (ECC) circuit 5230, a host interface 5250, and a nonvolatile memory interface 5260. The buffer memory 5220 stores data used to drive the SSD controller 5200. The buffer memory 5220 includes multiple memory lines, each storing data or a command. The ECC circuit 5230 calculates error correction code values of data to be programmed at a writing operation, and corrects an error of read data using an error correction code value at a read operation. In a data recovery operation, The ECC circuit 5230 corrects an error of data recovered from the nonvolatile memory devices 5100.

Embodiments of the inventive concept may be applied to any electronic devices and systems including a nonvolatile memory device. For example, embodiments of the inventive concept may be applied to systems such as a memory card, a solid state drive (SSD), an embedded multimedia card (eMMC), a universal flash storage (UFS), a mobile phone, a smartphone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an Internet of Things (IoT) device, an Internet of Everything (IoE) device, an e-book, a virtual reality (VR) device, an augmented reality (AR) device, a server system, an automotive driving system, etc.

The foregoing is illustrative of example embodiments and is not to be construed as limiting thereof Although a few example embodiments have been described, those skilled in the art will readily appreciate that many modifications are possible in the example embodiments without materially departing from the present inventive concept.

What is claimed is:

1. A method of operating a nonvolatile memory device, comprising:
    grouping aggressor memory cells connected to one or more aggressor wordlines into a plurality of aggressor cell groups by performing a read operation with respect to the aggressor wordlines based on one or more grouping read voltages, the aggressor wordlines being adjacent to a selected wordline corresponding to a read address among a plurality of wordlines of a memory block;
    grouping selected memory cells connected to the selected wordline into a plurality of selected cell groups respectively corresponding to the plurality of aggressor cell groups;
    determining a plurality of group read conditions respectively corresponding to the plurality of selected cell groups; and
    performing a plurality of group read operations with respect to the plurality of selected cell groups based on the plurality of group read conditions,
    wherein the aggressor wordlines include a main aggressor wordline adjacent to the selected wordline in a first direction and a sub aggressor wordline adjacent to the selected wordline in a second direction opposite to the first direction, and
    wherein the main aggressor wordline is programmed after the selected wordline is programmed, and the sub aggressor wordline is programmed before the selected wordline is programmed.

2. The method of claim 1, wherein determining the plurality of group read conditions includes:
    performing valley search operations with respect to each of the plurality of selected cell groups; and
    determining a plurality of group read voltage sets respectively corresponding to the plurality of selected cell groups based on the valley search operations.

3. The method of claim 1, further comprising:
    detecting a degeneration degree of retention characteristics of the memory block; and
    setting the plurality of aggressor cell groups based on the degeneration degree.

4. The method of claim 3, wherein setting the plurality of aggressor cell groups includes:
    determining a number of the plurality of aggressor cell groups based on the degeneration degree.

5. The method of claim 3, further comprising:
    increasing a number of the plurality of aggressor cell groups by increasing the number of the grouping read voltages as the degeneration degree increases.

6. The method of claim 3, wherein detecting the degeneration degree includes:
    detecting a cell count based on one or more cell count read voltages, the cell count corresponding to a number of on cells or a number of off cells among memory cells of the memory block.

7. The method of claim 3, wherein setting the plurality of aggressor cell groups includes:
    determining a number of the aggressor wordlines based on the degeneration degree.

8. The method of claim 3, further comprising:
    increasing a number of the aggressor wordlines as the degeneration degree increases.

9. The method of claim 1, wherein the nonvolatile memory device is a three-dimensional nonvolatile memory device including a memory cell array such that the memory block of the memory cell array includes a plurality cell strings coupled between a plurality of bitlines and a source line, each cell string includes a plurality of memory cells stacked in a vertical direction, and the plurality of wordlines are stacked in the vertical direction.

10. The method of claim 9, further comprising:
    performing a program operation in a downward direction from an uppermost wordline with respect to the plurality of wordlines of the memory block,
    wherein the aggressor wordlines include one wordline adjacent to the selected wordline in the downward direction.

11. The method of claim 9, further comprising:
    performing a program operation in an upward direction from a lowest wordline with respect to the plurality of wordlines of the memory block,
    wherein the aggressor wordlines include one wordline adjacent to the selected wordline in the upward direction.

12. The method of claim 9, wherein the aggressor wordlines include a main aggressor wordline adjacent to the selected wordline in a first direction and a sub aggressor wordline adjacent to the main aggressor wordline in the first direction.

13. The method of claim 1, wherein determining the plurality of group read conditions includes:
    setting a precharge time and a develop time such that at least one of the precharge time and the develop time is different between at least two selected cell groups among the plurality of selected cell groups.

14. The method of claim 13, wherein at least one of the precharge time and the develop time is increased as a threshold voltage of an aggressor cell group corresponding to a selected cell group is increased.

15. A nonvolatile memory device comprising:
    a memory cell array including a memory block having a plurality cell strings disposed between a plurality of bitlines and a source line, each cell string includes a plurality of memory cells stacked in a vertical direction, and a plurality of wordlines stacked in the vertical direction; and a control circuit configured to:
- group aggressor memory cells connected to one or more aggressor wordlines into a plurality of aggressor cell groups by performing a read operation with respect to the aggressor wordlines based on one or more grouping read voltages, the aggressor wordlines being adjacent to a selected wordline corresponding to a read address among the plurality of wordlines of a memory block;
- group selected memory cells connected to the selected wordline into a plurality of selected cell groups respectively corresponding to the plurality of aggressor cell groups;
- determine a plurality of group read conditions respectively corresponding to the plurality of selected cell groups; and
- perform a plurality of group read operations with respect to the plurality of selected cell groups based on the plurality of group read conditions,
- wherein the aggressor wordlines include a main aggressor wordline adjacent to the selected wordline in a first direction and a sub aggressor wordline adjacent to the selected wordline in a second direction opposite to the first direction, and
- wherein the main aggressor wordline is programmed after the selected wordline is programmed, and the sub aggressor wordline is programmed before the selected wordline is programmed.

16. The nonvolatile memory device of claim 15, wherein the control circuit is further configured to:
- perform valley search operations with respect to each of the plurality of selected cell groups; and
- determine a plurality of group read voltage sets respectively corresponding to the plurality of selected cell groups based on the valley search operations.

17. The nonvolatile memory device of claim 15, wherein the control circuit is further configured to:
- detect a degeneration degree of retention characteristics of the memory block; and
- set the plurality of aggressor cell groups based on the degeneration degree.

18. A nonvolatile memory device comprising:
- a plurality of first metal pads disposed in a cell region;
- a plurality of second metal pads disposed in a peripheral region disposed under the cell region, wherein the peripheral region is vertically connected to the cell region by the plurality of first metal pads and the plurality of second metal pads;
- a memory cell array disposed in the cell region, the memory cell array including a memory block having a plurality cell strings coupled between a plurality of bitlines and a source line, each cell string includes a plurality of memory cells stacked in a vertical direction, and a plurality of wordlines stacked in the vertical direction; and
- a control circuit disposed in the peripheral region and configured to:
  - group aggressor memory cells connected to one or more aggressor wordlines into a plurality of aggressor cell groups by performing a read operation with respect to the aggressor wordlines based on one or more grouping read voltages, the aggressor wordlines being adjacent to a selected wordline corresponding to a read address among the plurality of wordlines of a memory block;
  - group selected memory cells connected to the selected wordline into a plurality of selected cell groups respectively corresponding to the plurality of aggressor cell groups;
  - determine a plurality of group read conditions respectively corresponding to the plurality of selected cell groups; and
  - perform a plurality of group read operations with respect to the plurality of selected cell groups based on the plurality of group read conditions,
  - wherein the aggressor wordlines include a main aggressor wordline adjacent to the selected wordline in a first direction and a sub aggressor wordline adjacent to the selected wordline in a second direction opposite to the first direction, and
  - wherein the main aggressor wordline is programmed after the selected wordline is programmed, and the sub aggressor wordline is programmed before the selected wordline is programmed.

* * * * *